(12) United States Patent
Tokita

(10) Patent No.: US 7,177,006 B2
(45) Date of Patent: Feb. 13, 2007

(54) EXPOSURE APPARATUS AND METHOD

(75) Inventor: Toshinobu Tokita, Tochigi-ken (JP)

(73) Assignee: Canon Kabushiki Kaisha, Tokyo (JP)

( * ) Notice: Subject to any disclaimer, the term of this patent is extended or adjusted under 35 U.S.C. 154(b) by 143 days.

(21) Appl. No.: 11/022,033

(22) Filed: Dec. 23, 2004

(65) Prior Publication Data
US 2005/0254026 A1 Nov. 17, 2005

(30) Foreign Application Priority Data
Dec. 26, 2003 (JP) .............................. 2003-433009

(51) Int. Cl.
G03B 27/52 (2006.01)
G03B 27/42 (2006.01)
G03B 27/72 (2006.01)
G03B 27/32 (2006.01)

(52) U.S. Cl. .............................. 355/30; 355/53; 355/72; 355/77

(58) Field of Classification Search ............... 355/30, 355/53, 72, 77
See application file for complete search history.

(56) References Cited

U.S. PATENT DOCUMENTS 6,952,253 B2 * 10/2005 Lof et al. .................... 355/30
2004/0211920 A1 * 10/2004 Derksen et al. ........... 250/492.1
2005/0134815 A1 * 6/2005 Van Santen et al. .......... 355/30
2006/0017900 A1 * 1/2006 Novak .......................... 355/55
2006/0023182 A1 * 2/2006 Novak et al. ................. 355/53
2006/0023183 A1 * 2/2006 Novak et al. ................. 355/53

FOREIGN PATENT DOCUMENTS

JP WO 99/49504 9/1999

OTHER PUBLICATIONS

Translation of WO 99/49504 cited by Applicant.*
B. Smith et al.; "Extreme-NA Water Immersion Lithography for 35-65 nm Technology"; International Symposium on 157nm Lithography; Rochester Institute of Technology; Sep. 3-6, 2002; (8 pages).

* cited by examiner

Primary Examiner—Alan Mathews
(74) Attorney, Agent, or Firm—Morgan & Finnegan, L.L.P.

(57) ABSTRACT

An exposure method includes the steps of introducing fluid to a space between a surface of an object to be exposed, and a final surface of a projection optical system, projecting a pattern on a mask onto the object via the projection optical system and the fluid, wherein the introducing step includes the steps of filling the fluid in the space between the surface of the object and the final surface of the projection optical system, and wherein the filling step changes a capillary attraction of the fluid different from the capillary attraction that operates during the projection step.

13 Claims, 15 Drawing Sheets

PRIOR ART

EXPOSURE APPARATUS AND METHOD

BACKGROUND OF THE INVENTION

The present invention relates generally to an exposure apparatus and method used to fabricate various devices including semiconductor chips such as ICs and LSIs, display devices such as liquid crystal panels, sensing devices such as magnetic heads, and image pick-up devices such as CCDs, as well as fine patterns used for micromechanics, and more particularly to an immersion type exposure method and apparatus that immerses the final surface of the projection optical system and the surface of the object in the fluid and exposes the object through the fluid.

A projection exposure apparatus has been conventionally used to transfer a circuit pattern on a reticle (or a mask) via a projection optical system onto a wafer etc., and the high-quality exposure at a high resolution has recently been increasingly demanded. The immersion exposure attracted people's attentions as one means that satisfies this demand. The immersion exposure promotes the higher numerical aperture ("NA") by replacing a medium (typically the air) at the wafer side of the projection exposure with fluid. The projection exposure apparatus has an NA=n·sin θ where n is a refractive index of the medium, and the NA increases when the medium that has a refractive index higher than the air's refractive index, i.e., n>1.

For the immersion exposure, some methods have already been proposed to fill the fluid in the space between the object to be exposed, and the optical element in the projection optical system that is closest to the object. See, for example, International Publication No. WO99/49504, and International Symposium on 157 nm Lithography, 3–6 Sep. 2002, Belgium, Bruce Smith et al. (Rochester Institute of Technology), Extreme-NA Water Immersion Lithography for 35–65 nm Technology. These prior art references propose to provide, as shown in FIG. 15A, a supply nozzle 18 and a recovery nozzle 20 near a final lens 14 in the projection optical system, and supplies fluid 16 from the supply nozzle 18 between the substrate W and the final lens 14. In addition, an air curtain 22 is formed by blowing compressed air to the outside of the fluid 16 and maintains the fluid 16 between the substrate W and the final lens 14. Here, FIG. 15A is a schematic sectional view for explaining the fluid supply and recovery by a conventional immersion type exposure apparatus. Since an introduction of the fluid 16, an interval between the substrate W and the final lens 14 is maintained to be a necessary interval for exposure, and the exposure becomes immediately ready after the introduction. The exposure is performed, while the supply nozzle 18 continuously supplies the fluid 16 and the recovery nozzle 20 continuously recovers the fluid 16 or while the fluid 16 circulates between the substrate W and the final lens 14.

However, the conventional immersion exposure shown in FIG. 15A causes the air bubbles to mix the fluid, in filling the fluid 16 in the space between the substrate W and the final lens 14. The air bubble shields the exposure light, results in lowered transfer accuracy and yield, and cannot satisfy the demand for the high-quality exposure. The air bubbles are likely to generate at the initial filling of the fluid, i.e., when the fluid 16 is filled in a space between the substrate W and the final lens 14, which space contains no fluid 16. FIG. 15B shows this state, and is a plane view of FIG. 15A viewed from a direction A. As shown in FIG. 15B, surfaces of the substrate W and the final lens 14 have part 24 that is hydrophilic to the fluid 16, and part 26 that is less hydrophilic to the fluid 16. These parts 24 and 26 may be considered to be located on a front surface of the substrate W or a bottom surface final lens 14. As a result, the fluid 16 is recovered from the recovery nozzle 20 through the part 24. Then, the air that exists above the part 26 is not squeezed out by the fluid 16, and remains as air bubbles. These air bubbles would never be eliminated completely irrespective of the subsequent continuous supply and recovery of the fluid 16.

BRIEF SUMMARY OF THE INVENTION

Accordingly, it is an exemplary object of the present invention to provide an exposure method and apparatus, which prevents the mixture of air bubbles and provide the high-quality exposure.

An exposure method according to one aspect of the present invention includes the steps of introducing fluid to a space between a surface of an object to be exposed, and a final surface of a projection optical system, projecting a pattern on a mask onto the object via the projection optical system and the fluid, wherein the introducing step includes the steps of filling the fluid in the space between the surface of the object and the final surface of the projection optical system, and wherein the filling step changes a capillary attraction of the fluid different from the capillary attraction that operates during the projection step.

An exposure method according to another aspect of the present invention includes the steps of introducing fluid to a space between a surface of an object to be exposed, and a final surface of a projection optical system, projecting a pattern on a mask onto the object via the projection optical system and the fluid, wherein the introducing step includes the steps of filling the fluid in the space between the surface of the object and the final surface of the projection optical system, and continuously supplying the fluid to and recovering the fluid from the space between the surface of the object and the final surface of the projection optical system, after the filling step, and wherein the filling step changes an introducing condition of the fluid differently from the supplying and recovering step.

An exposure apparatus according to another aspect of the present invention includes a projection optical system for projecting a pattern on a mask onto an object to be exposed, fluid in which a surface of the object and a final surface of the projection optical system is immersed, the object being exposed via the projection optical system and the fluid, a first mechanism for filing a space between the surface of the object and the final surface of the projection optical system, a second mechanism for continuously supplying the fluid to and recovering the fluid from the space between the surface of the object and the final surface of the projection optical system, and a controller for controlling the first mechanism so that the first mechanism introduces the fluid in an introducing condition different from that of the second mechanism.

A device manufacturing method according to still another aspect of the present invention includes the steps of exposing an object using the above exposure, and developing an object that has been exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to the accompanying drawings.

DETAILED DESCRIPTION OF THE PREFERRED EMBODIMENTS

Figure 1:
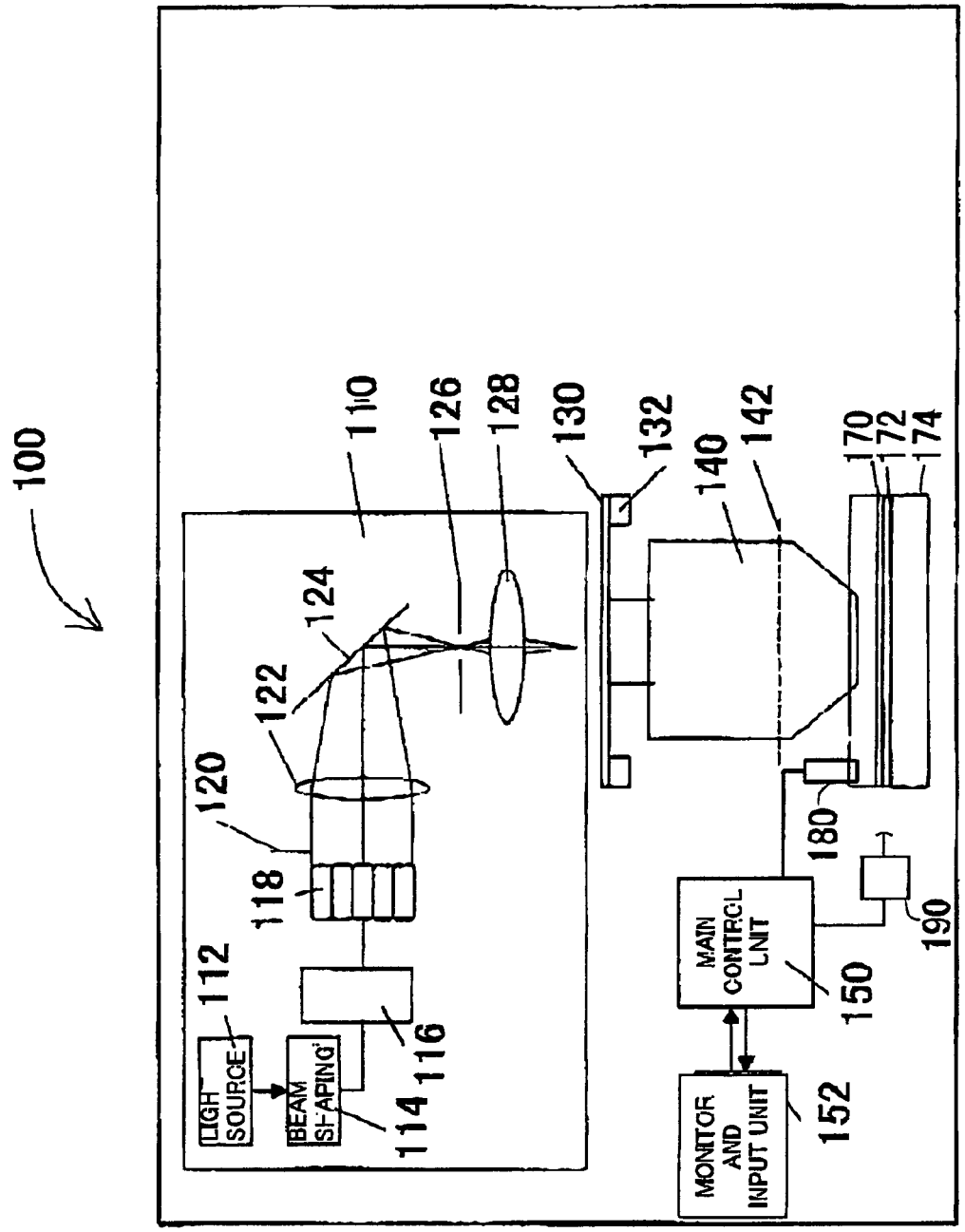
FIG. 1 is a schematic block diagram of an exposure apparatus according to one embodiment of the present invention.

Referring now to FIG. 1, a description will be given of an exposure apparatus 100 of one embodiment according to the present invention. Here, FIG. 1 is a schematic block diagram of the exposure apparatus 100. The exposure apparatus 100 includes, as shown in FIG. 1, an illumination apparatus 110, a mask (or a reticle) 130, a reticle stage 132, a projection optical system 140, a main control unit 150, a monitor and input apparatus 152, a wafer 170, a wafer stage 174, a supply/recovery mechanism 180 that supplies the fluid 181 as a medium, and a detector 190. The exposure apparatus 100 is an immersion type exposure apparatus that partially or entirely immerges the final surface of the final optical element of the projection optical system 140 at the wafer 170 side, and exposes a pattern on the mask 130 onto the wafer 170 via the fluid 181. While the exposure apparatus 100 of the instant embodiment is a projection exposure apparatus in a step and scan manner, the present invention is applicable to a step and repeat manner and other exposure methods.

The illumination apparatus 100 illuminates the mask 130, on which a circuit pattern to be transferred is formed, and includes a light source section and an illumination optical system.

The light source section includes laser 112 as a light source, and a beam shaping system 114. The laser 112 may be pulsed laser such as an ArF excimer laser with a wavelength of approximately 193 nm, a KrF excimer laser with a wavelength of approximately 248 nm, a $F_2$ laser with a wavelength of approximately 157 nm, etc. A kind of laser, the number of laser units, and a type of light source section is not limited.

The beam shaping system 114 can use, for example, a beam expander, etc., with a plurality of cylindrical lenses, and convert an aspect ratio of the size of the sectional shape of a parallel beam from the laser 112 into a desired value (for example, by changing the sectional shape from a rectangle to a square), thus reshaping the beam shape to a desired one. The beam shaping system 114 forms a beam that has a size and divergent angle necessary for illuminating an optical integrator 118 described later.

The illumination optical system is an optical system that illuminates the mask 130, and includes a condenser optical system 116, an optical integrator 118, an aperture stop 120, a condenser lens 122, a deflecting mirror 124, a masking blade 126, and an imaging lens 128 in this embodiment. The illumination optical system 120 can realize various illumination modes, such as conventional illumination, annular illumination, quadrupole illumination, etc.

The condenser optical system 116 includes plural optical elements, and efficiently introduces a beam with the desired shape into the optical integrator 118. For example, the condenser optical system 116 includes a zoom lens system, and controls the shape and angular distribution of the incident beam to the optical integrator 118. The condenser optical system 116 further includes an exposure dose regulator that can change an exposure dose of light for illuminating the mask 130 per illumination.

The optical integrator 118 makes uniform illumination light that illuminates the mask 130, includes as a fly-eye lens in the instant embodiment for converting an angular distribution of incident light into a positional distribution, thus exiting the light. The fly-eye lens is so maintained that its incident plane and its exit plane are in the Fourier transformation relationship, and a multiplicity of rod lenses (or fine lens elements) However, the optical integrator 118 usable for the present invention is not limited to the fly-eye lens, and can include an optical rod, a diffraction grating, a plural pairs of cylindrical lens array plates that are arranged so that these pairs are orthogonal to each other, etc.

Right after the exit plane of the optical integrator 118 is provided the aperture stop 120 that has a fixed shape and diameter. The aperture stop 120 is arranged at a position approximately conjugate to the effective light source on the pupil 142 of the projection optical system 140, as described later, and the aperture shape of the aperture stop 120 corresponds to the effective light source shape on the pupil 142 surface in the projection optical system 140. The aperture shape of the aperture stop 120 defines a shape of the effective light source, as described later. Various aperture stops can be switched so that it is located on the optical path by a stop exchange mechanism (not shown) according to illumination conditions.

The condenser lens 122 collects all the beams that have exited from a secondary light source near the exit plane of the optical integrator 118 and passed through the aperture stop 120. The beams are reflected by the mirror 124, and uniformly illuminate or Koehler-illuminate the masking blade 126.

The masking blade 126 includes plural movable light shielding plates, and has an arbitrary opening corresponding to the effective area shape of the projection optical system 140. The light that has passed through the opening of the masking blade 126 is used as illumination light for the mask 130. The masking blade 126 is a stop having an automatically variable opening width, thus making a transfer area changeable. The exposure apparatus 100 may further include a scan blade, with a structure similar to the above masking blade 126, which makes the exposure changeable in the scan direction. The scan blade is also a stop having an automatically variable opening width, and is placed at an optically approximately conjugate position to the surface of the mask 130. Thus, the exposure apparatus can use these two variable blades to set the dimensions of the transfer area in accordance with the dimensions of an exposure shot.

The imaging lens 128 transfers an opening shape of the masking blade 126 onto the surface of the reticle 130 to be illuminated, and projects a reduced image of a pattern on the reticle 130 onto the wafer 170 held on the holder 172, which will be described later.

The mask 130 has a circuit pattern or a pattern to be transferred, and is supported and driven by a mask stage 132. Diffracted light emitted from the mask 130 passes the projection optical system 140, and then is projected onto the wafer 170. The wafer 170 is an object to be exposed, and the resist is coated thereon. The mask 130 and the wafer 170 are located in an optically conjugate relationship. The exposure apparatus in this embodiment is a step-and-scan type exposure apparatus (i.e., "scanner"), and therefore, scans the mask 130 and the wafer 170 to transfer a pattern on the mask 130 onto the wafer 170. When it is a step-and-repeat type exposure apparatus (i.e., "stepper"), the mask 130 and the wafer 170 are kept stationary for exposure.

The mask stage 132 supports the mask 130, and is connected to a transport mechanism (not shown). The mask stage 132 and the projection optical system 140 are installed on a lens barrel stool supported via a damper, for example, to a base frame placed on the floor. The mask stage 132 can use any structure known in the art. The transport mechanism (not shown) is made up of a linear motor and the like, and drives the mask stage 132 in X-Y directions, thus moving the mask 130.

The projection optical system 140 serves to image the diffracted light that has generated by the patterns formed on the mask 130 onto the wafer 170. The projection optical system 140 may use an optical system solely composed of a plurality of lens elements, an optical system comprised of a plurality of lens elements and at least one concave mirror (a catadioptric optical system), an optical system comprised of a plurality of lens elements and at least one diffractive optical element such as a kinoform, and a full mirror type optical system, and so on. Any necessary correction of the chromatic aberration is available through a plurality of lens units made from glass materials having different dispersion values (Abbe values), or arrange a diffractive optical element such that it disperses in a direction opposite to that of the lens unit. Otherwise, the compensation of the chromatic aberration is done with the narrowing of spectral width of the laser. Nowadays, line-narrowed MOPA laser is one of the main stream.

The main control unit 150 controls driving of each component, and particularly controls the fluid filling based on information input into the input device of the monitor and input device 152, information obtained by the detector 190, and a program stored in a memory (not shown). More specifically, the main control unit 150 controls the supply/recovery mechanism 180, the wafer stage 174, which will be described later, etc., so that the fluid 181 is supplied between the wafer 170 and the final optical element of the projection optical system 140 without mixing the air bubbles in the fluid 181. Control information and other information for the main control unit 150 are indicated on the display of the monitor and input device 152.

The wafer 170 is replaced with a liquid crystal plate and another object to be exposed in another embodiment. The photoresist is coated on a substrate 174. The wafer 170 is mounted on the wafer stage 174 via a holder 172, such as a wafer chuck. The holder 172 may use any holding method known in the art, such as a vacuum holding and electrostatic holding, and a detailed description thereof will be omitted. The stage 174 may use any structure known in the art, and preferably utilizes 6-axis coax. For example, the stage 174 uses a linear motor to move the wafer 170 in XYZ directions. The mask 130 and wafer 170 are, for example, scanned synchronously, and the positions of the mask stage 132 and wafer stage 174 are monitored, for example, by a laser interferometer and the like, so that both are driven at a constant speed ratio. The stage 174 is installed on a stage stool supported on the floor and the like, for example, via a dumper. The mask stage 132 and the projection optical system 140 are installed on a barrel stool supported, via a damper, etc., on a base frame mounted on the floor.

The supply/recovery mechanism 180 includes a supply nozzle 182 that supplies the fluid 181 to the space between the final surface of the projection optical system 140 and the wafer 170, and a recovery nozzle 184 that recovers the fluid 181 from the space.

The bottom surface of the projection optical system 140 closest to the wafer 170 is immersed in the liquid 181. A material selected for the liquid 181 has good transmittance to the wavelength of the exposure light, does not contaminate the projection optical system 140, and matches the resist process. The fluid 181 is, for example, pure water or a fluorine compound, and selected according to the resist coated on the wafer 170 and the exposure light's wavelength. The coating of the last element of the projection optical system 140 protects the element from the water.

The detector 190 is an observing means for observing the filling state of the fluid 181, for detecting a distance between the final surface of the projection optical system 140 and the surface of the wafer 170, and for detecting an inclined angle of the wafer stage 174.

Figure 2:
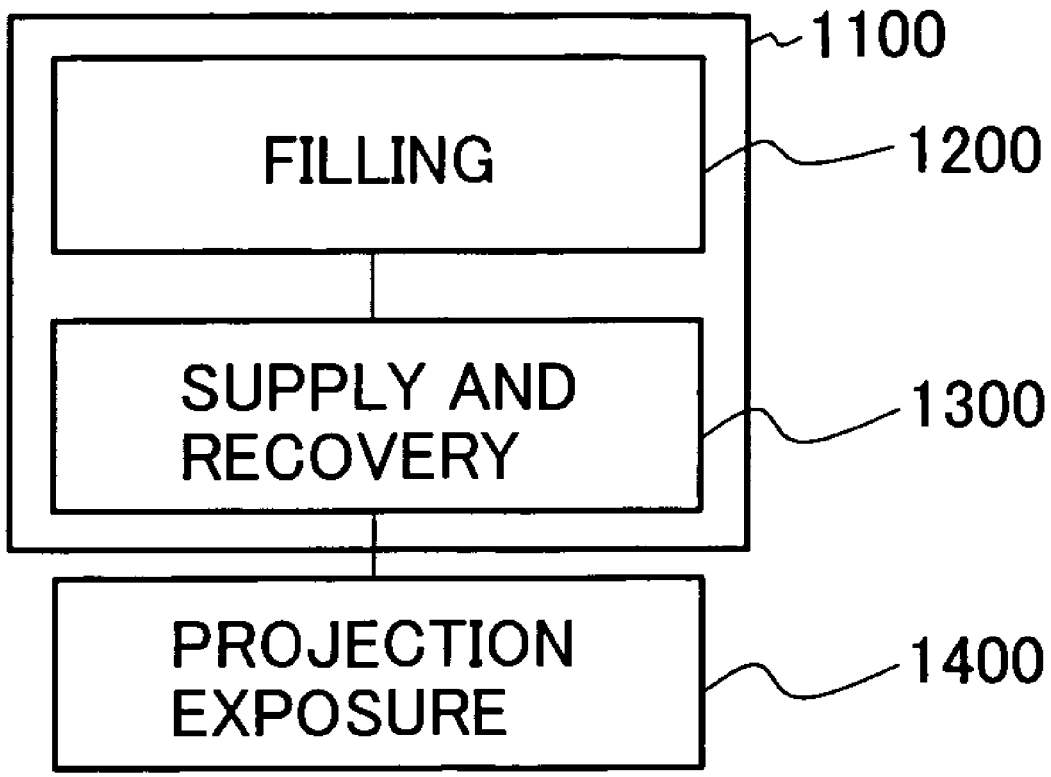
FIG. 2 is a flowchart for explaining an exposure apparatus by the exposure apparatus shown in FIG. 1.

Referring now to FIG. 2, a description will be given of an exposure method according to one embodiment of the present invention. Here, FIG. 2 is a flowchart of this exposure apparatus. The exposure method of the instant embodiment includes the steps of: introducing the fluid 181 between the surface of the wafer 170 and the final surface of the optical element in the projection optical system 140 closest to the wafer 170 (step 1100); and projecting a pattern on the mask 130 onto the wafer 170 via the projection optical system 140 and the fluid 181 (step 1400) In particular, the step 1100 includes the steps of: filling the fluid 181 between the surface of the wafer 170 and the final surface of the projection optical system 140 (step 1200); and, after the step 1200, continuously supplying the fluid 181 to and recovering the fluid 181 from the space between the surface of the wafer 170 and the final surface of the projection optical system 140 (step 1300). The flowchart shown in FIG. 2 is stored as software or firmware in the memory (not shown), and the main control unit 150 provides exposure based on the software or firmware.

A description will be given of the filling step 1200 according to several embodiments of the present invention.

First Embodiment

Figure 3:
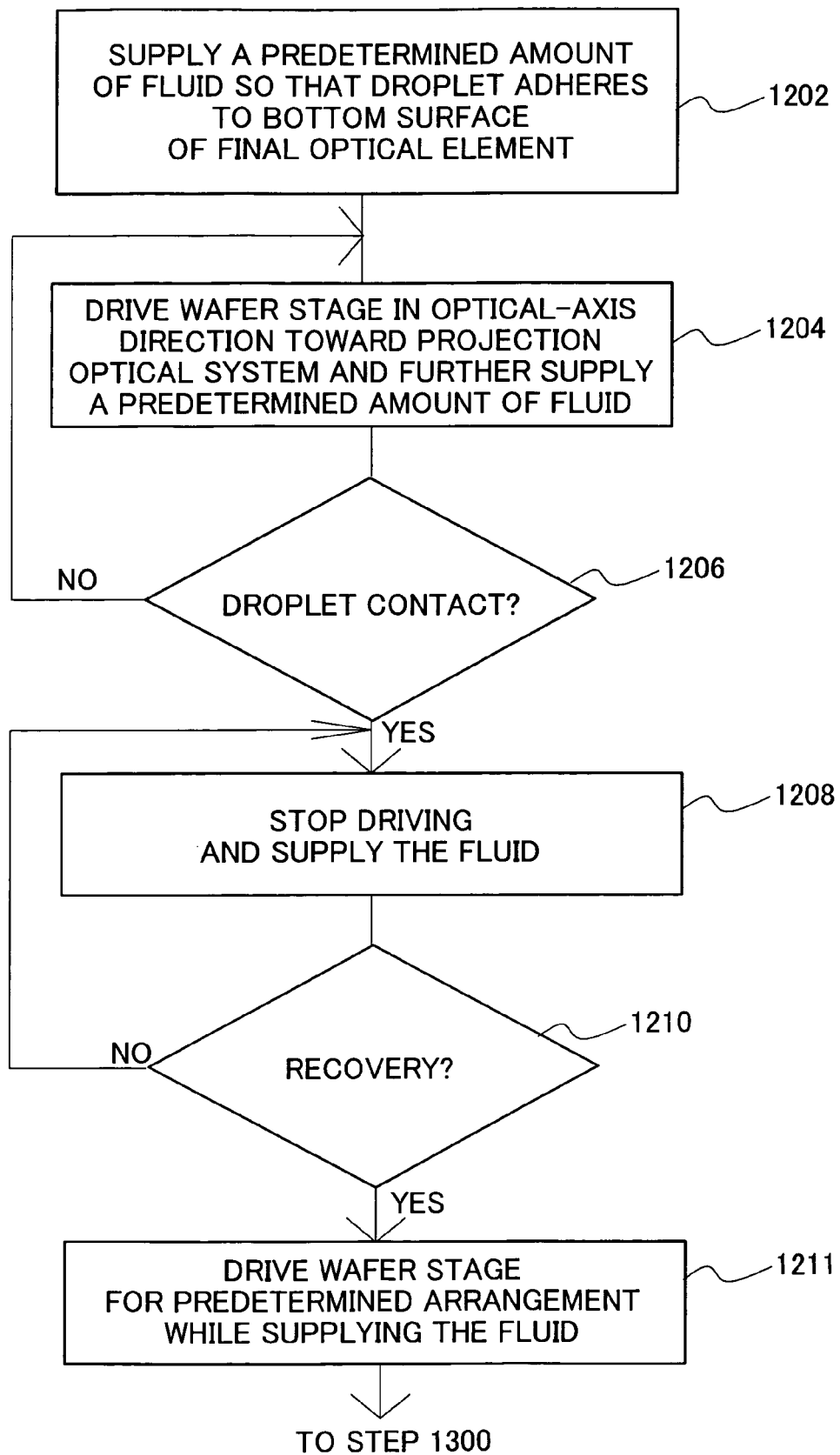
FIG. 3 is a flowchart of a filling step of a first embodiment in the exposure method shown in FIG. 2.

Referring now to FIGS. 3 and 4, a description will be given of the filling step 1200 of a first embodiment. Here, FIG. 3 is a flowchart of the filling step 1200 of the first embodiment. FIG. 4 is a schematic enlarged sectional view near the wafer 170 and the final optical element 144 that is closest to the wafer 170 in the projection optical system 140 in each sub-step in the filling step 1200 of the first embodiment. While air curtains are actually formed outside the supply nozzle 182 and the recovery nozzle 184 in FIG. 4, FIG. 4 omits them for illustration purposes. This is true of the following description.

In the initial state, the fluid 181 does not exist but the air exists between the surface 171 of the wafer 170 and the bottom surface 145 of the final optical element 144. A distance between the bottom surface 145 and the surface 171 is set to a distance in the step 1300 or 1400, although the present invention is not limited to this distance.

Figure 4A:
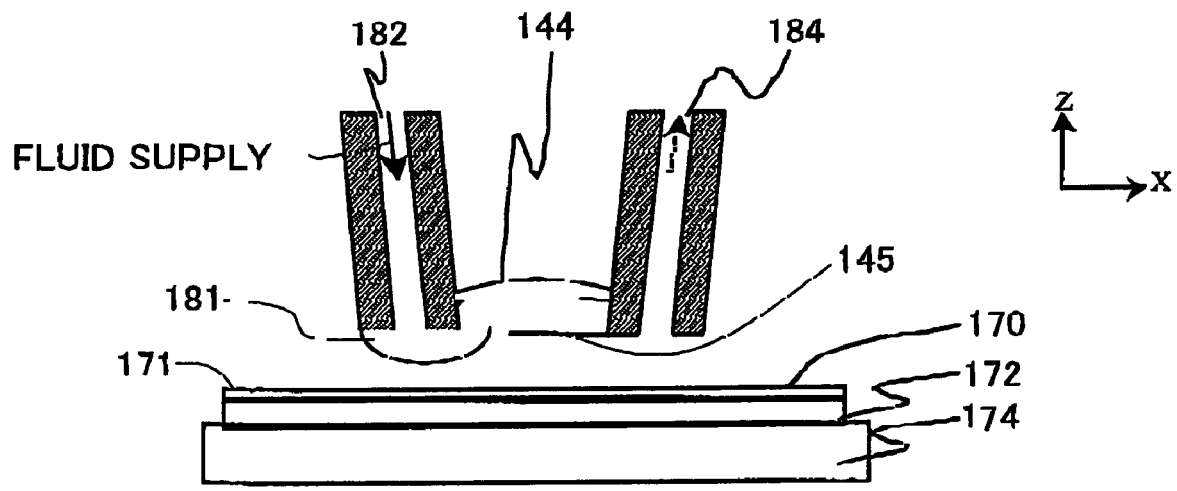
FIGS. 4A, 4B and 4C are schematic partial enlarged sectional views of an exposure apparatus shown in FIG. 1 for explaining a filling step shown in FIG. 3.

First, the main control unit 150 supplies a predetermined amount of fluid 181 from the supply nozzle 182 by controlling a supply source (not shown), as shown in FIG. 4A, so that the droplet adheres to the bottom surface 145 of the final optical element 144 (step 1202). The predetermined amount is the amount by which the droplet of the fluid 181 does not fall on the wafer 170, and by which the fluid 181 contacts the tip of the nozzle 182 and the bottom surface 145 of the final optical element 144 and remains at the contact portion by its surface tension.

Figure 4B:
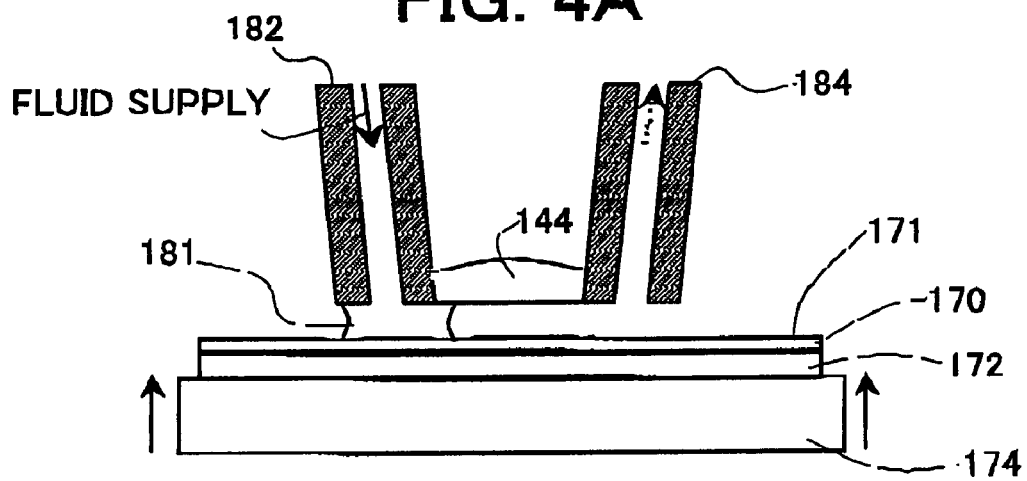
Figure 15A:
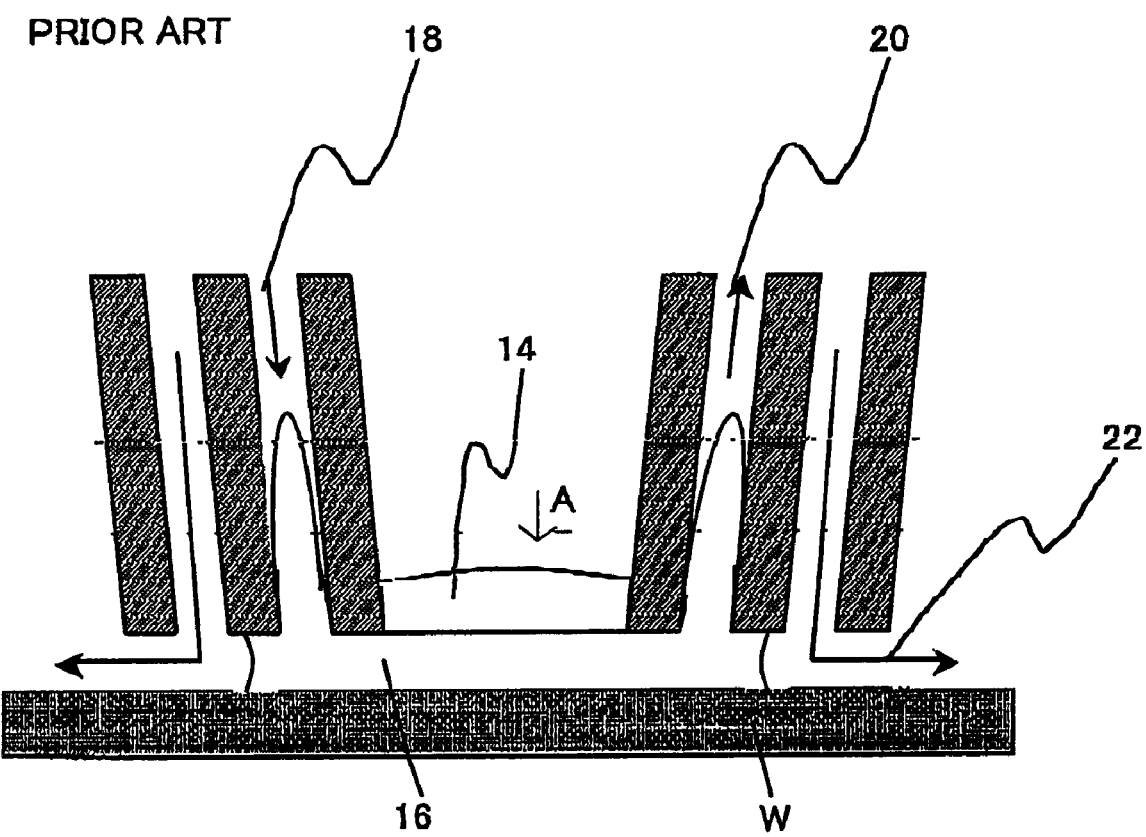
FIGS. 15A and 15B are partial enlarged sectional and plane views for explaining a fluid filling method in a conventional immersion type exposure apparatus.
Figure 15B:
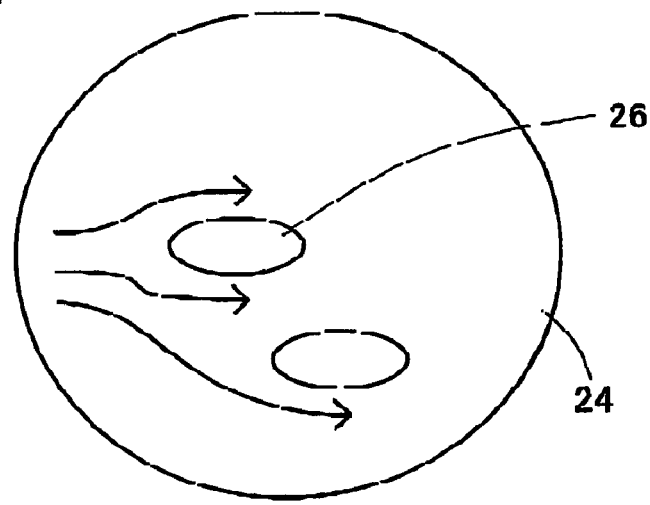

Next, the main control unit 150 controls the driving unit (not shown) and drives the wafer stage 174 in the optical-axis direction (or Z direction) so that the fluid 181 contacts the wafer 170, as shown in FIG. 4B (step 1204). During this step, the wafer stage 174 may be driven while the fluid 181 is supplied from the supply nozzle 182. However, it is preferable to control the supply amount until the step 1206's predetermined interval, which will be described later. This is because without the control over the supply amount, the recovery nozzle 181 recovers the fluid 181 before the capillary attraction becomes a predetermined force, as described later, and the part 26 may occur as shown in FIG. 15. Of course, according to the present invention, the step 1204 may not supply the fluid 181.

According to the present invention, a distance between the bottom surface 145 and the surface 171 may be narrower than a distance of the step 1300 or 1400 before the step 1202 begins. The main control unit 150 determines whether the droplet of the fluid 181 contacts the surface 171 of the wafer 170 based on the detection result by the detector 190 or the amount of fluid 181 supplied form the supply nozzle 182. The main control unit 150 can control the speed of the wafer stage 174 in the Z direction through the driving unit before and after the contact occurs.

Next, the main control unit 150 determines whether the droplet contacts the surface 171 of the wafer 170 based on the detection result by the detector 190, and continues to drive the wafer stage 174 until the droplet contacts the surface 171 (loop of the steps 1206 and 1204). The contact of the droplet may be detected by the actual contact. In order to prevent the collision between the bottom surface 145 and the surface 171, the main control unit 150 preferably indicates a warning on the monitor 152 when detecting that a distance between surfaces 145 and 171 becomes a predetermined interval without a detection of the contact.

Alternatively, the detector 190 may detect the droplet's contact by detecting whether the distance between surfaces 145 and 171 becomes the predetermined interval, which has been stored in the memory (not shown) in advance. The predetermined interval is a distance that prevents the collision between the bottom surface 145 and the surface 171, and is enough small for the fluid 181 to spread over the part 26 due to the capillary attraction, which has been described with reference to FIG. 15B.

The low moving speed of the wafer stage 174 in the Z direction is preferred for the above reasons. For example, the sequence associated with the Z driving includes a feed, a recovery, and an alignment measurement of the wafer 170, and a real-time leveling during the exposure. These operations require high speed driving for throughput, and low speed control of the Z driving of the wafer stage 174 is preferred after the step of touching the fluid 181 to the surface 171, or the steps from FIG. 4B to FIG. 4C.

Figure 4C:
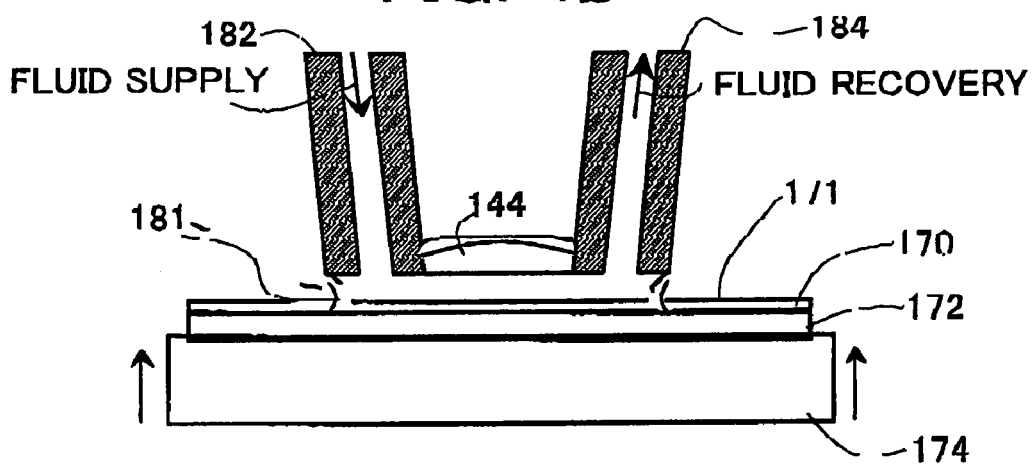

When determining that the droplet contacts the surface 171 (step 1206), the main control unit 150 stops driving the wafer stage 174 and supplies the fluid 181 (step 1208). Thereby, the space between the bottom surface 145 and the surface 171 is small enough for the capillarity, and the sufficient capillary attraction fills the fluid 181 in the space between the wafer 170 and the optical element 144 without mixing the air bubbles as shown in FIG. 4C. The step 1208 preferably controls the supply amount of fluid 181 from the supply nozzle 182. This is because if the fluid 181 is supplied at a higher speed than that of the spread speed of the capillary attraction, the part 26 could occur as shown in FIG. 15. Of course, according to the present invention, the step 1208 may not supply the fluid 181. Thus, this embodiment increases the capillary attraction higher than that in steps 1300 or 1400 and spreads the fluid 181 over the part 26 shown in FIG. 15, taking into account that the capillary attraction is in inverse proportion to the interval between the bottom surface 145 and the surface 171.

Next, the main control unit 150 determines whether the recovery nozzle 184 has recovered the fluid 181 (step 1210). When determining that the recovery nozzle 184 has not yet recovered the fluid 181 (step 1210), the main control unit 150 continues the step 1208.

When determining that the recovery nozzle 184 has recovered the fluid 181 (step 1210), the main control unit 150 supplies the fluid 181 and drives the wafer stage 174 so that the projection optical system 140 and the wafer 170 become at desired states in the step 1300 or 1400 (or the exposure state) (step 1211). At that time, if necessary, the main control unit 150 may control (for example, increase) the supply amount of fluid 181 differently from the step 1208 by controlling the supply source (not shown). The step 1211 enlarges the small interval between the bottom surface 145 of the optical element 144 and the wafer 170 to a desired interval, and needs to prevent backflow or mixture of the air bubbles due to the pressure reduction.

Then, the procedure moves to the following step 1300.

Second Embodiment

Figure 5:
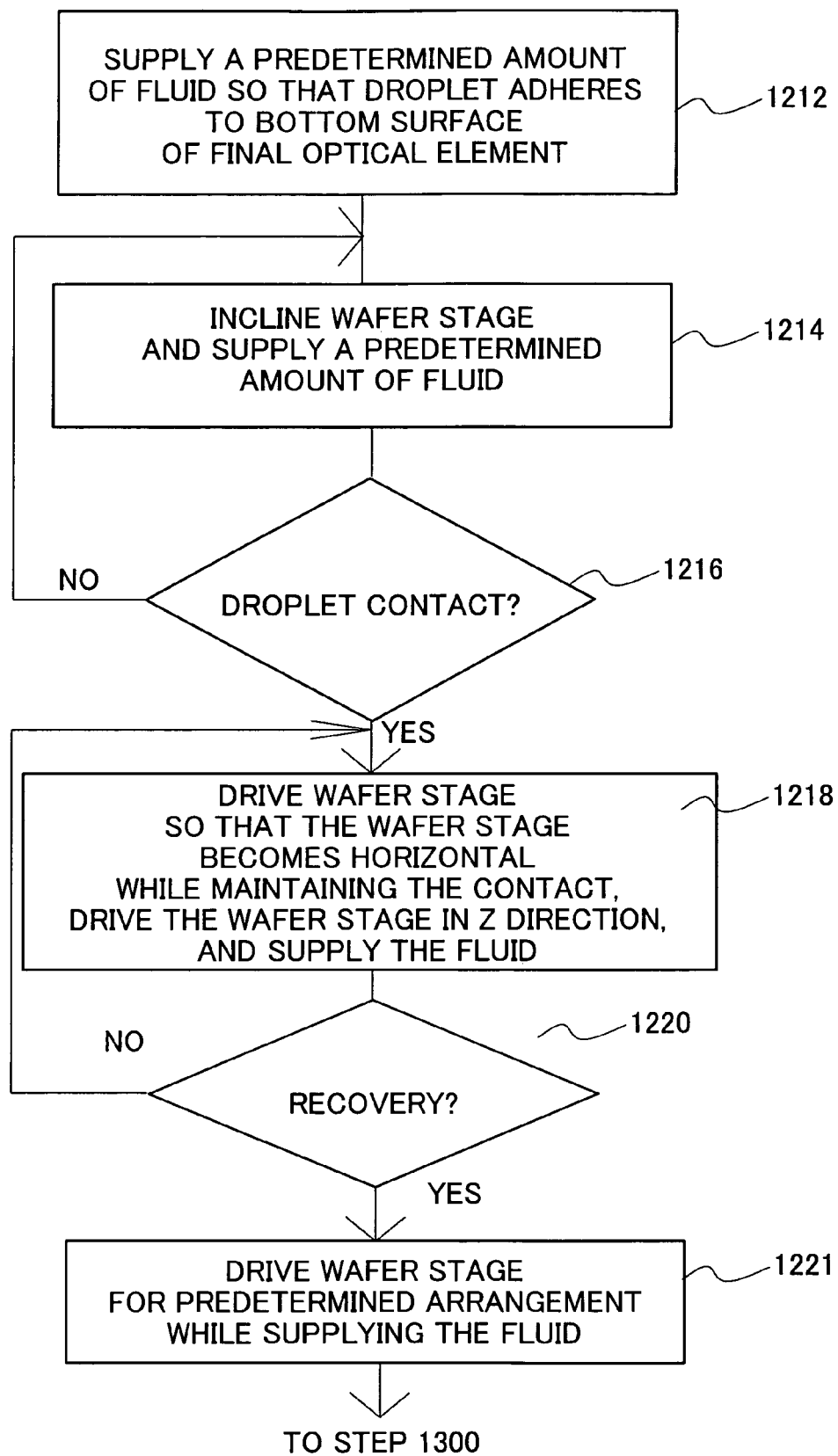
FIG. 5 is a flowchart of a filling step of a second embodiment in the exposure method shown in FIG. 2.

Referring now to FIGS. 5 and 6, a description will be given of the filling step 1200 according to a second embodiment. Here, FIG. 5 is a flowchart of the filling step 1200 of the second embodiment. FIG. 6 is a schematic enlarged sectional view near the wafer 170 and the final optical element 144 in the projection optical system 140 in each sub-step in the filling step 1200 of the second embodiment. The initial state is similar to that in the first embodiment.

Figure 6A:
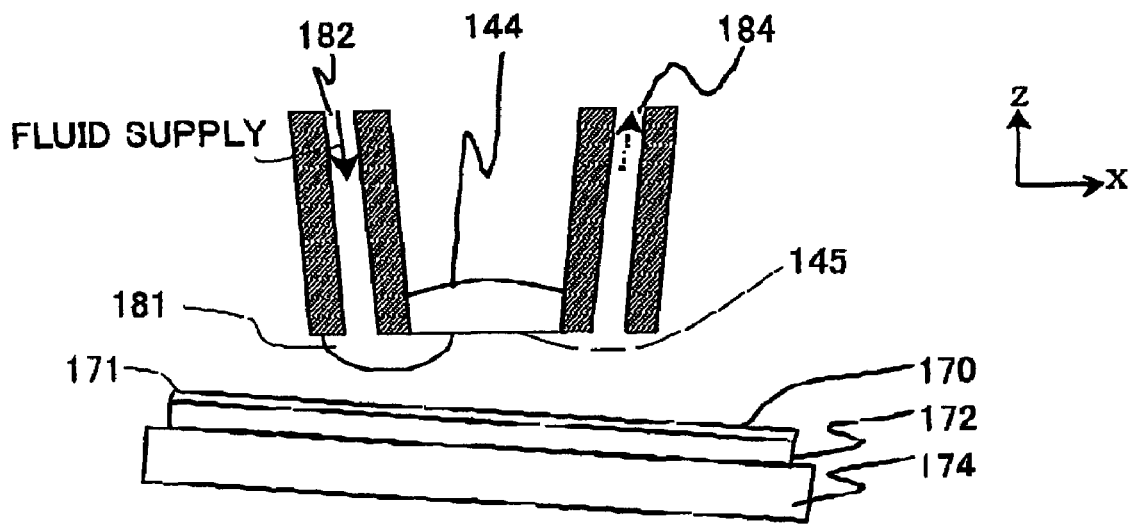
FIGS. 6A, 6B and 6C are schematic partial enlarged sectional views of an exposure apparatus shown in FIG. 1 for explaining a filling step shown in FIG. 5.

First, similar to the step 1202, the main control unit 150 supplies a predetermined amount of fluid 181 from the supply nozzle 182 by controlling the supply source (not shown), as shown in FIG. 6A, so that the droplet adheres to the bottom surface 145 of the final optical element 144 (step 1212).

Figure 6B:
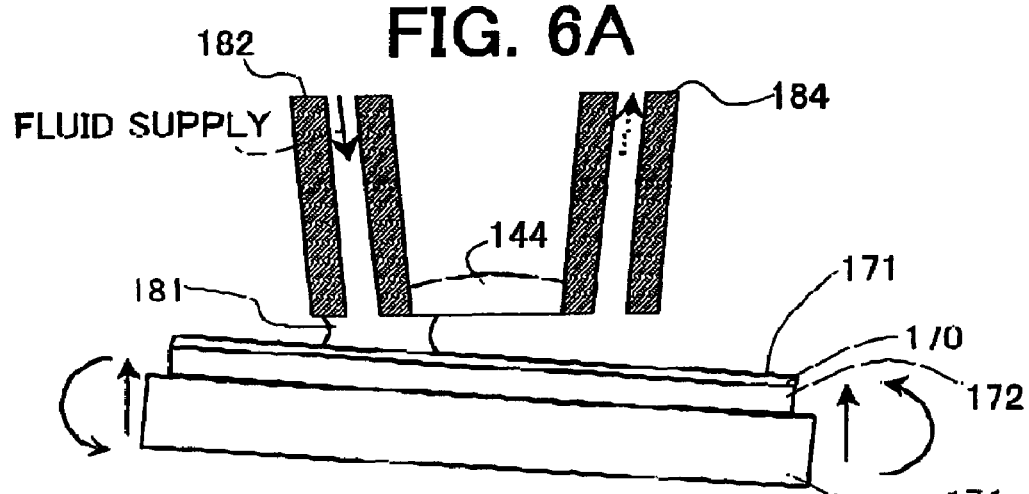

Next, the main control unit 150 controls the driving unit (not shown) and changes an inclination angle of the wafer stage 174 in the optical-axis direction (or Z direction) so that the fluid 181 contacts the wafer 170, as shown in FIGS. 6A and 6B (step 1214). The inclination angle is changed through driving in ωx (around the X-axis), in ωy (around the Y-axis), or at least around one axis. The wafer stage 174 may be driven while the supply nozzle 182 supplies the fluid 181. Alternatively, the main control unit 150 preferably controls the inclination speed so as to prevent the mixture of the air bubbles. According to the present invention, the surface 171 may be previously inclined relative to the angle (i.e., a horizontal state) in the step 1300 or 1400. The main control unit 150 can know the inclination angle of the wafer stage 174 based on the detection result by the detector 190 or the driving unit (not shown).

The main control unit 150 determines whether the droplet contacts the surface 171 of the wafer 170 based on the detection result by the detector 190, and continues to drive the wafer stage 174 until the droplet contacts the surface 171 (loop of the steps 1216 and 1214).

Figure 6C:
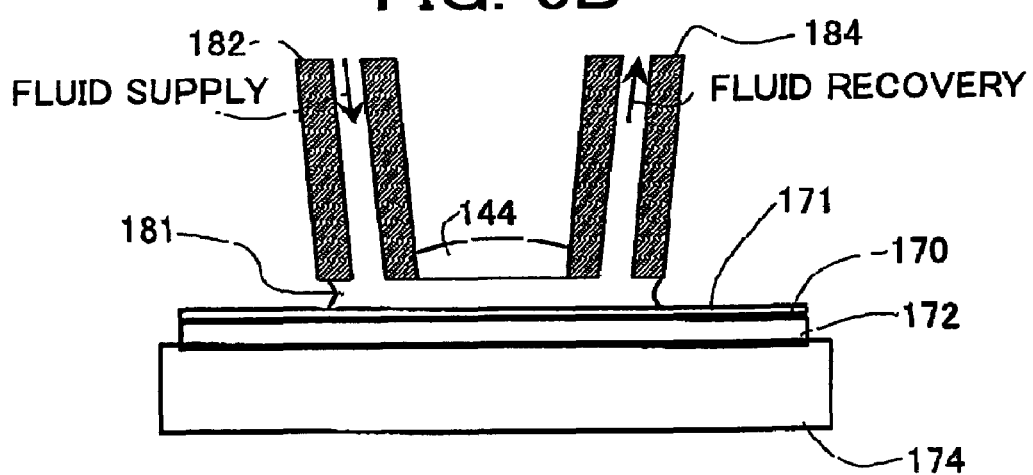

When determining that the droplet contacts the surface 171 (step 1216), the main control unit 150 drives the wafer stage 174 via the driving unit (not shown) so that the inclination angle becomes horizontal as shown in FIG. 6C, and moves the wafer stage 174 in the Z direction (step 1218). In this case, for the above reasons, the inclination angle changing speed and the moving speed in the Z direction may be controlled to a low speed. For example, the sequence associated with the Z, ωx and ωy driving includes a feed, a recovery, and an alignment measurement of the wafer 170, and a real-time leveling during the exposure. These operations require high speed driving for throughput, and low speed control of the Z, ωx and ωy driving of the wafer stage 174 is preferable after the step of touching the fluid 181 to the surface 171, or the steps from FIG. 6B to FIG. 6C.

As a result, the space between the bottom surface 145 and the surface 171 is small enough for the capillarity, and the sufficient capillary attraction fills the fluid 181 in the space between the wafer 170 and the optical element 144 without mixing the air bubbles as shown in FIG. 6C. The step 1218 preferably controls the supply amount of fluid 181 from the supply nozzle 182. This is because if the fluid 181 is supplied at a higher speed than that of the spread speed of the capillary attraction, the part 26 could occur as shown in FIG. 15. Of course, according to the present invention, the step 1218 may not supply the fluid 181. Thus, this embodiment increases the capillary attraction higher than that in steps 1300 or 1400 and spread the fluid 181 over the part 26 shown in FIG. 15, taking into account that the capillary attraction is in inverse proportion to the interval between the bottom surface 145 and the surface 171.

Next, the main control unit 150 determines whether the recovery nozzle 184 has recovered the fluid 181 (step 1220). When determining that the recovery nozzle 184 has not yet recovered the fluid 181 (step 1220), the main control unit 150 continues the step 1218.

When determining that the recovery nozzle 184 has recovered the fluid 181 (step 1220), the main control unit 150 supplies the fluid 181 and drives the wafer stage 174 so that the projection optical system 140 and the wafer 170 become at the desired state in the step 1300 or 1400 (or the exposure state) (step 1221). At that time, if necessary, the main control unit 150 may control (for example, increase) the supply amount of fluid 181 differently from the step 1218 by controlling the supply source (not shown). The step 1221 enlarges the small interval between the bottom surface 145 of the optical element 144 and the wafer 170 to a desired interval, and needs to prevent backflow or mixture of the air bubbles due to the pressure reduction.

Then, the procedure moves to the following step 1300.

Third Embodiment

Figure 7:
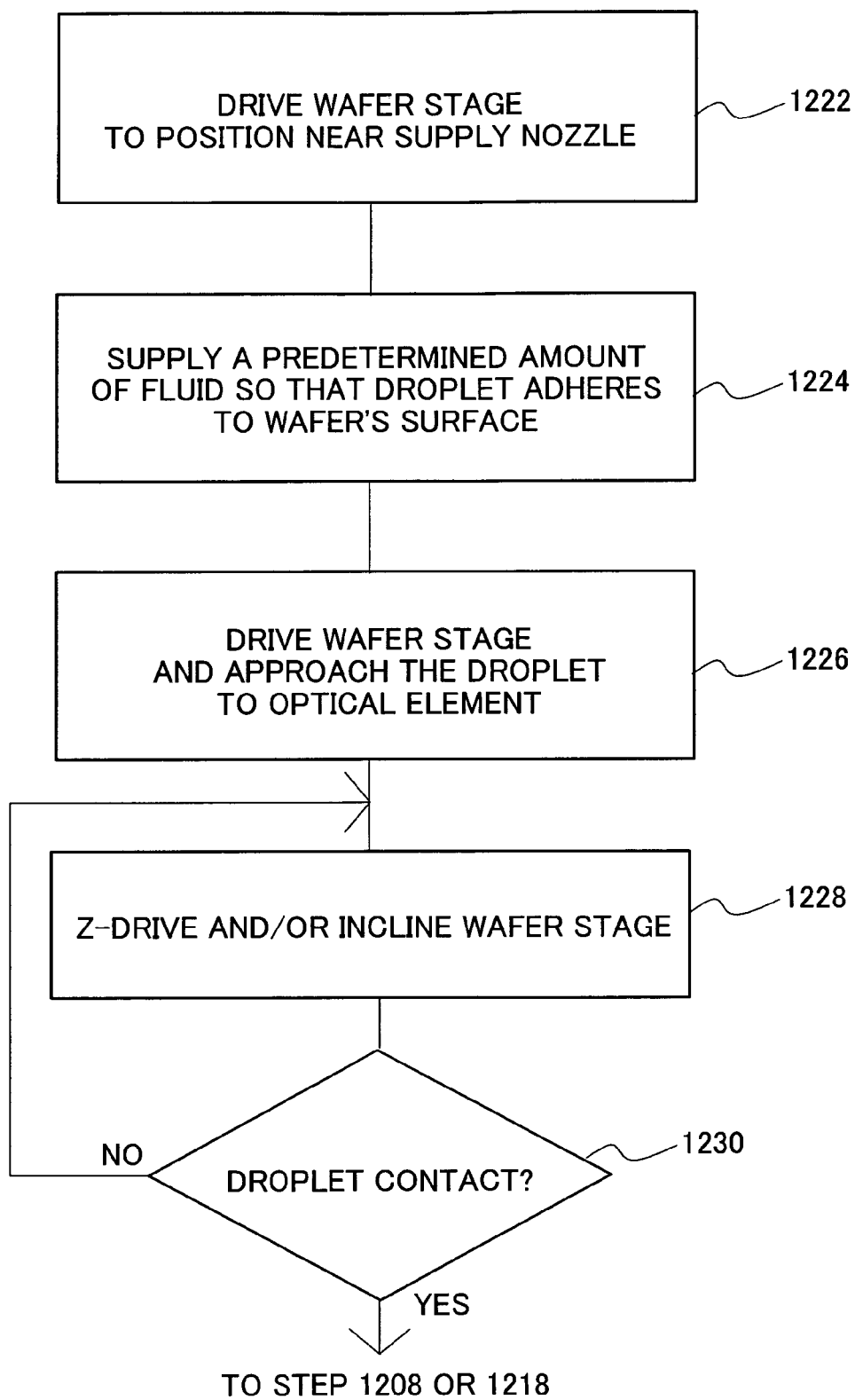
FIG. 7 is a flowchart of a filling step of a third embodiment in the exposure method shown in FIG. 2.
Figure 8A:
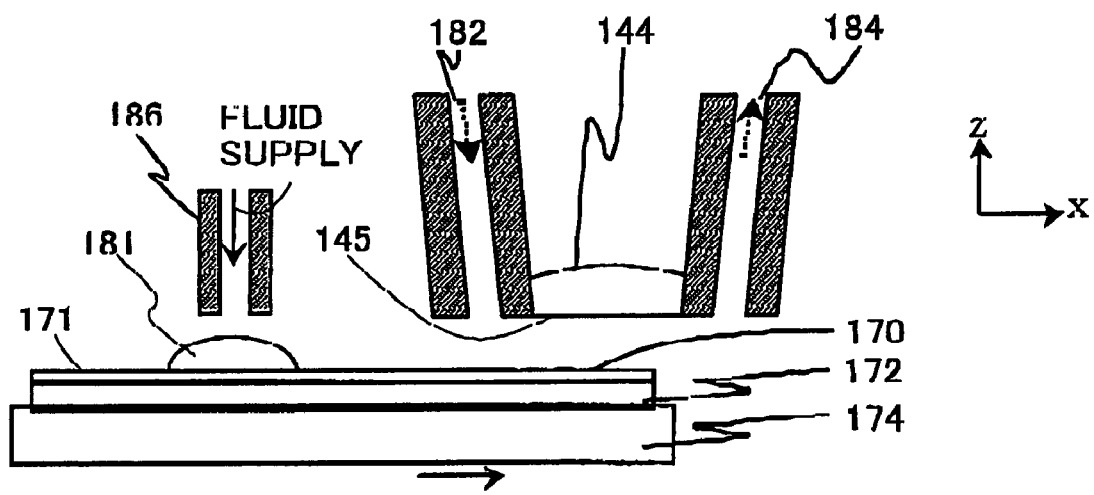
FIGS. 8A, 8B and 8C are schematic partial enlarged sectional views of an exposure apparatus shown in FIG. 1 for explaining a filling step shown in FIG. 7.

Referring now to FIGS. 7 and 8, a description will be given of the filling step 1200 according to a third embodiment. Here, FIG. 7 is a flowchart of the filling step 1200 of the third embodiment. FIG. 8 is a schematic enlarged sectional view near the wafer 170 and the final optical element 144 in the projection optical system 140 in each sub-step in the filling step 1200 of the third embodiment. As described for the first embodiment, the initial state of this embodiment maintains a positional relationship between the optical element 144 and the wafer 170 as that in the step 1300 or 1400. Alternatively, the positional relationship may be as shown in FIG. 8A.

A description will be given of only a structure different from those of the first and second embodiments. Referring to FIG. 8, this embodiment provides the supply/recovery mechanism 180 with a supply nozzle 186 that is apart from the supply nozzle 182 and supplies the fluid 181 to the surface 171 of the wafer 170 in addition to the supply nozzle 182. The supply nozzle 186 may be level with the supply nozzle 182 in the Z direction, or may not be, e.g., it is below the supply nozzle 182. The supply nozzle 186 may be driven in the Z direction. This embodiment arranges the supply nozzles 182 and 186 level with each other in the Z direction.

First, the main control unit 150 drives the wafer stage 174 to a position near the supply nozzle 186 as shown in FIG. 8A (step 1222). In this embodiment, the main control unit 150 drives the wafer stage 174 in the −Z direction, then in the XY directions, and finally in the Z direction. In an alternate embodiment, the main control unit 150 drives the wafer stage 174 only in the XY directions, and the supply nozzle 186 in the −Z direction. Only if a position of the supply nozzle 186 is located below the supply nozzle 182, it is enough that the main control unit 150 drives the wafer stage 174 in the XY directions. If necessary, the main control unit 150 may incline the wafer stage 174 in an arbitrary direction and move the surface 171 to the supply nozzle 186 in any one of the above driving actions. In the step 1224, which will be described later, if the flow amount and velocity (or the supply amount) is too large, the air bubbles generate when the fluid 181 contacts the surface 171 of the wafer 170. The main control unit 150 thus preferably drives the wafer stage 174 so that the tip of the supply nozzle 186 moves to the surface 171 of the wafer 170 as close as possible.

Next, the main control unit 150 supplies a predetermined amount of fluid 181 from the supply nozzle 186 by controlling the supply source (not shown), as shown in FIG. 8A, so that the droplet adheres to the surface 171 of the wafer 170 (step 1224). While the supply nozzle 186 in FIG. 8A supplies the fluid 181 to the surface 171 of the wafer 170 from the perpendicular direction, the present invention is not limited to this embodiment. For example, the fluid 181 may be supplied to the wafer 170 in a horizontal or oblique direction of the surface 171. As discussed above, the main control unit 150 preferably controls a supply amount of fluid 181 by controlling the supply source (not shown), so as to prevent the mixture of the air bubbles at the time of supply and the following step 1226.

Figure 8B:
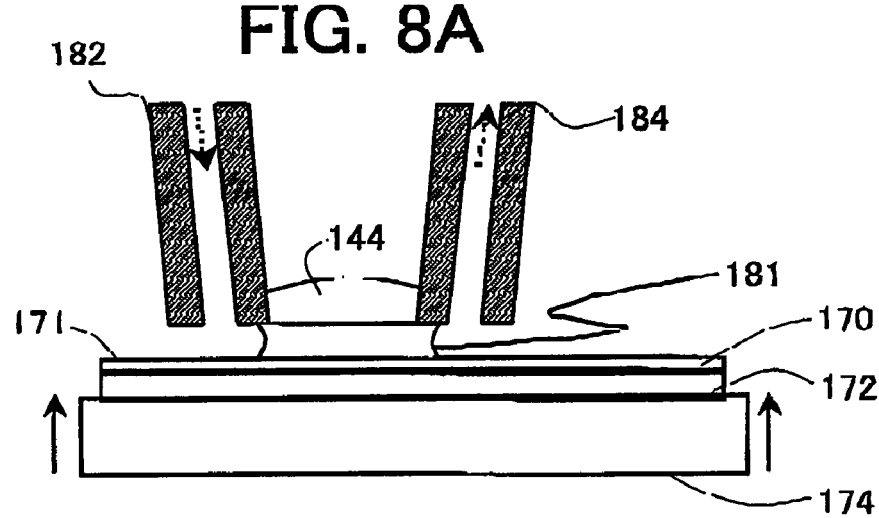

Next, the main control unit 150 drives the wafer stage 174 so that the droplet on the surface 171 approaches to the optical element 144, as shown in FIG. 8B (step 1226). In this embodiment, the main control unit 150 drives the wafer stage 174 in the −Z direction, and then in the XY directions. In an alternate embodiment, the main control unit 150 drives the supply nozzle 186 in the Z direction, and the wafer stage 174 only in the XY directions. Only if a position of the supply nozzle 186 is located below the supply nozzle 182, it is enough that the main control unit 150 drives the wafer stage 174 only in the XY directions. In this case, a distance between the surface 171 of the wafer 170 and the bottom surface 145 of the optical element is preferably large to some extent. A small interval would cause the fluid 181 to adhere to the side part of the supply nozzle 182 during the XY driving time. In addition, if the step 1222 inclines the wafer stage 174, the main control unit 150 drives the wafer stage 174 in the XY directions so as to make the surface 171 of the wafer 170 horizontal. FIG. 8B omits an inclination of the wafer stage 174.

In the step 1226, the droplet does not contact the bottom surface 145 of the optical element 144. Accordingly, the main control unit 150 drives the wafer stage 174 in the Z direction. In addition to or instead of this driving, the main control unit 150 inclines the wafer stage 174 in an arbitrary direction and touches the fluid 181 to the bottom surface 145 of the optical element 144 (step 1228). FIG. 8B shows that the boundary of the meniscus of the fluid 181 ranges from the supply port of the supply nozzle 182 or recovery port of the recovery nozzle 184 to the inside, or toward the optical element 144. When this boundary extends to the supply port of the supply nozzle 182, it is preferable to supply the fluid 181 from the supply nozzle 182 with the Z, ωx and ωy driving of the wafer stage 174. However, in this case, as discussed above, the main control unit 150 preferably controls the supply amount of fluid 181.

Figure 8C:
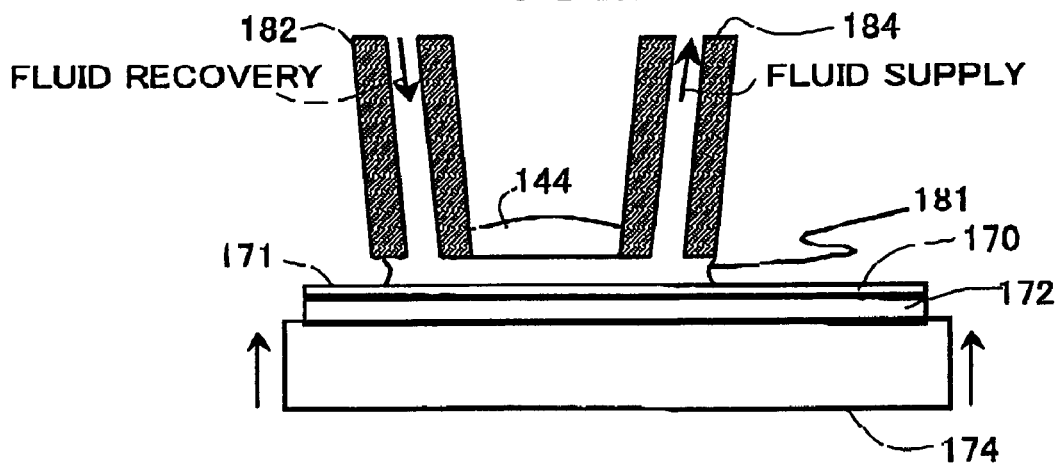

The main control unit 150 determines whether the droplet contacts the bottom surface 145 of the optical element 144 based on the detection result by the detector 190 (step 1230). The main control unit 150 continues driving in the step 1228 until the droplet contacts the bottom surface 145 of the optical element 144. When determining that the droplet contacts the bottom surface 145, the procedure moves to the step 1208 or 1218. As a result, even in this embodiment, the sufficient capillary attraction fills the fluid 181 in the space between the wafer 170 and the optical element 144 without mixing the air bubbles as shown in FIG. 8C.

FIG. 8A uses the supply nozzle 186 to initially supply the fluid 181 to the surface 171 of the wafer 170, because the supply amount is smaller than the supply amount of fluid 181 from the supply nozzle 182. However, when the main control unit 150 controls the supply amount so that the supply nozzle 182 supplies the fluid in the step 1224, the supply nozzle 182 serves as and supersedes the supply nozzle 186.

Fourth Embodiment

Figure 9:
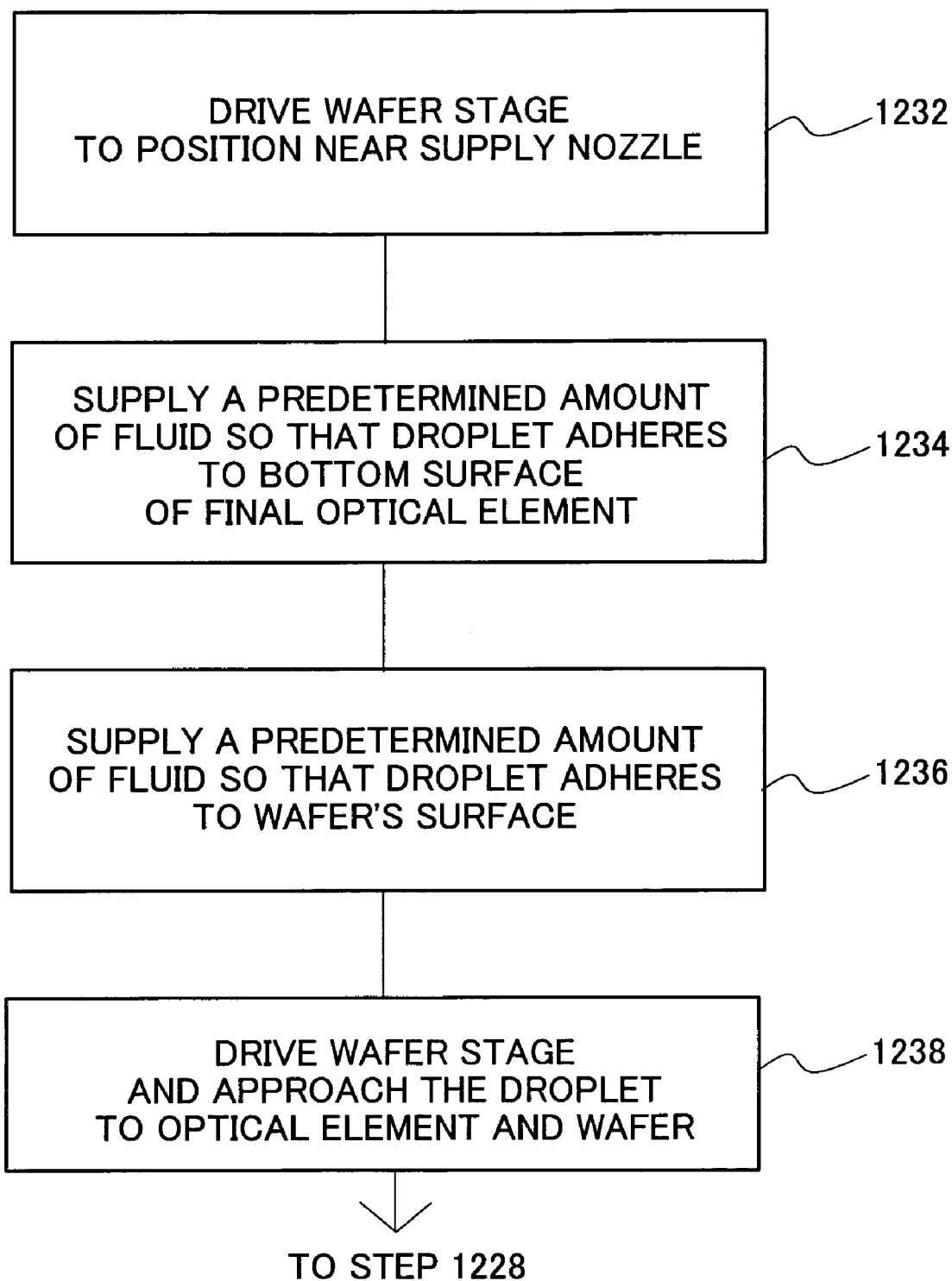
FIG. 9 is a flowchart of a filling step of a fourth embodiment in the exposure method shown in FIG. 2.

Referring now to FIGS. 9 and 10, a description will be given of the filling step 1200 according to a fourth embodiment. Here, FIG. 9 is a flowchart of the filling step 1200 of the fourth embodiment. FIG. 10 is a schematic enlarged sectional view near the wafer 170 and the final optical element 144 in the projection optical system 140 in each sub-step in the filling step 1200 of the fourth embodiment. The initial state of this embodiment is similar to that of the third embodiment. The structure of this embodiment is similar to that of the third embodiment. In the first to third embodiments, an initial supply position of the fluid 181 is located on one of the optical element 144 and the wafer 170, whereas the instant embodiment supplies the fluid 181 to both members.

Figure 10A:
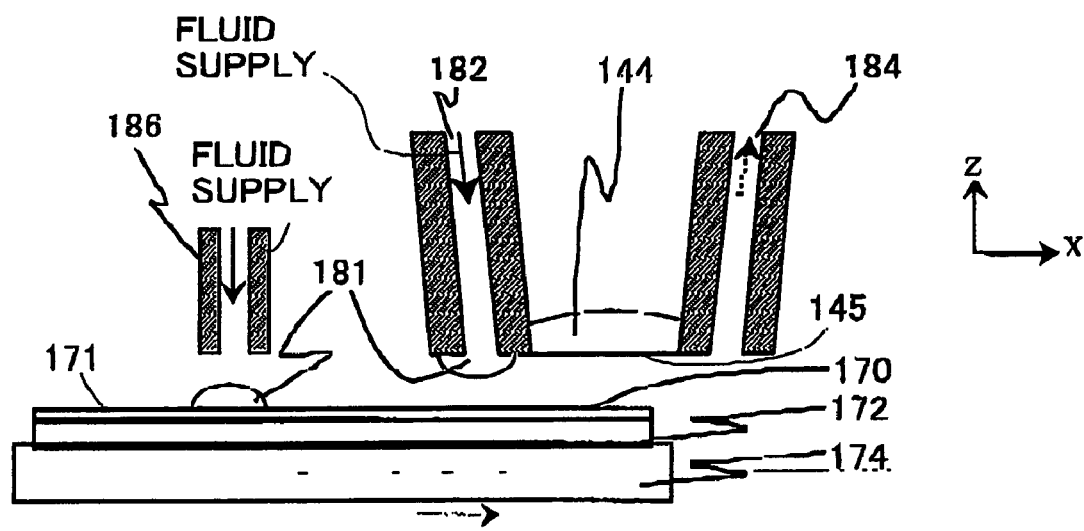
FIGS. 10A, 10B and 10C are schematic partial enlarged sectional views of an exposure apparatus shown in FIG. 1 for explaining a filling step shown in FIG. 9.

First, the main controller 150 drives, similar to the step 1222, the wafer stage 174 to a position close to the supply nozzle 186, as shown in FIG. 10 (step 1232). Next, the main control unit 150 supplies, similar to the step 1202, a predetermined amount of fluid 181 from the supply nozzle 182 by controlling a supply source (not shown), as shown in FIG. 10A, so that the droplet adheres to the bottom surface 145 of the final optical element 144 (step 1234). Next, the main control unit 150 supplies, similar to the step 1224, a predetermined amount of fluid 181 from the supply nozzle 186 by controlling the supply source (not shown), as shown in FIG. 10A, so that the droplet adheres to the surface 171 of the wafer 170 (step 1236). The order of the steps 1234 and 1236 may be arbitrary.

Figure 10B:
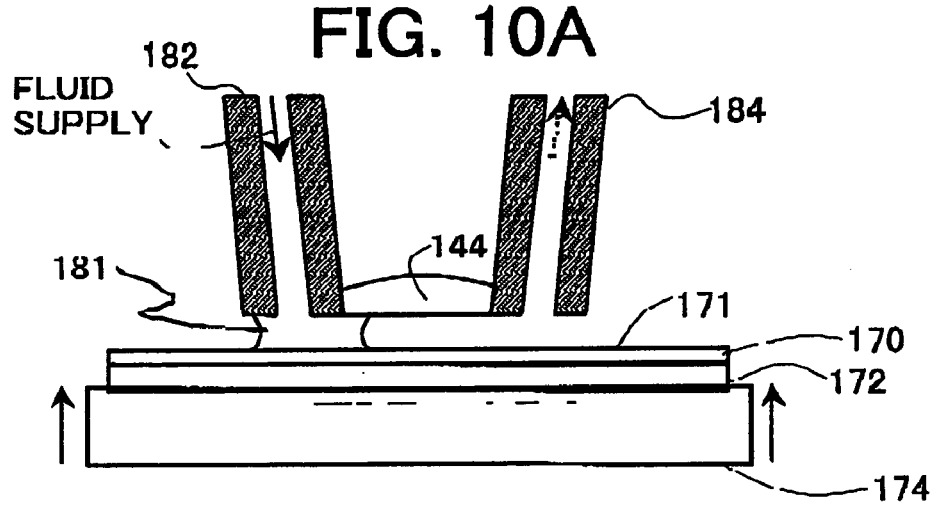
Figure 10C:
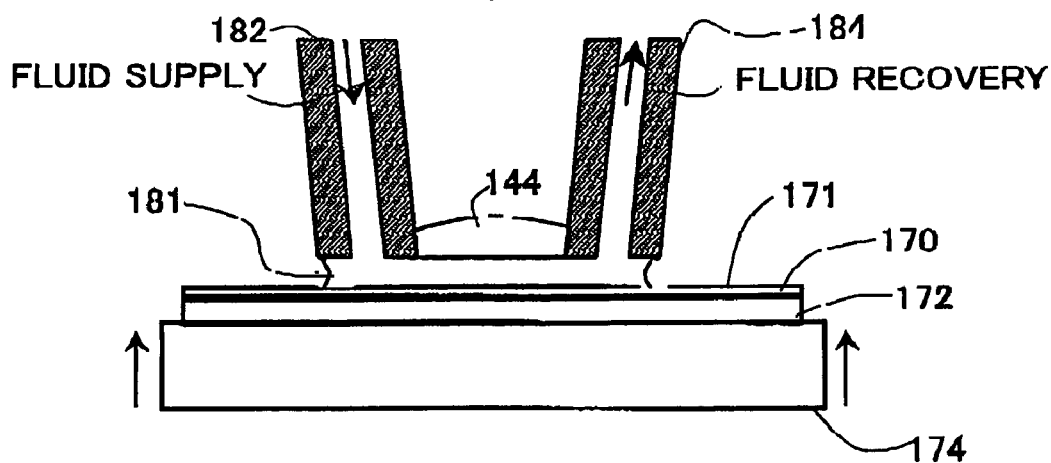

Next, the main control unit 150 drives the wafer stage 174 so that the droplet on the bottom surface 145 approaches to the wafer 170, and the droplet on the surface 171 approaches to the optical element 144 (step 1238). The driving method is similar to that in the step 1226. FIG. 10B omits an inclination of the wafer stage 174. Then, the process moves to the step 1228. As a result, even in this embodiment, the sufficient capillary attraction fills the fluid 181 in the space between the wafer 170 and the optical element 144 without mixing the air bubbles as shown in FIG. 10C.

Fifth Embodiment

Figure 11:
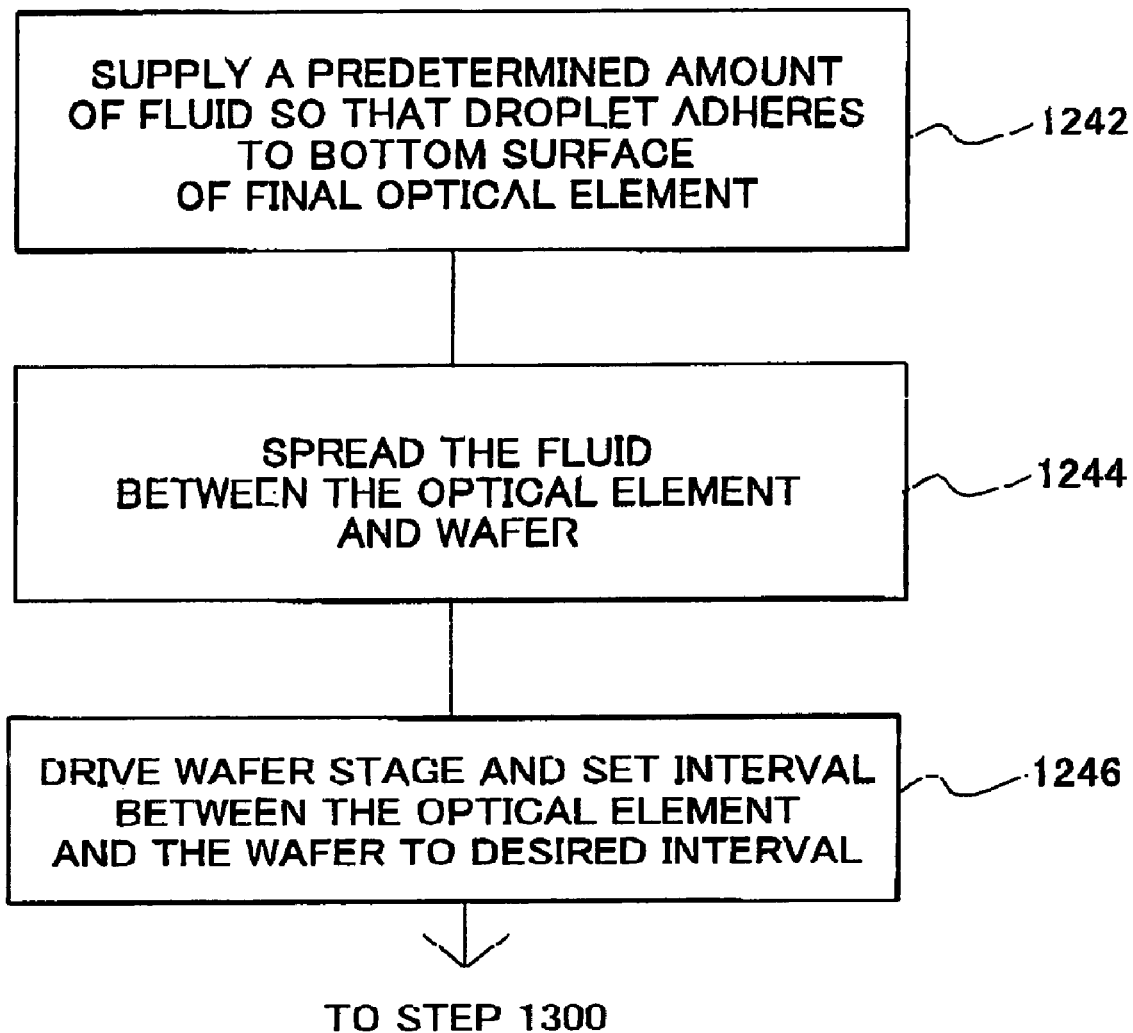
FIG. 11 is a flowchart of a filling step of a fifth embodiment in the exposure method shown in FIG. 2.
Figure 12A:
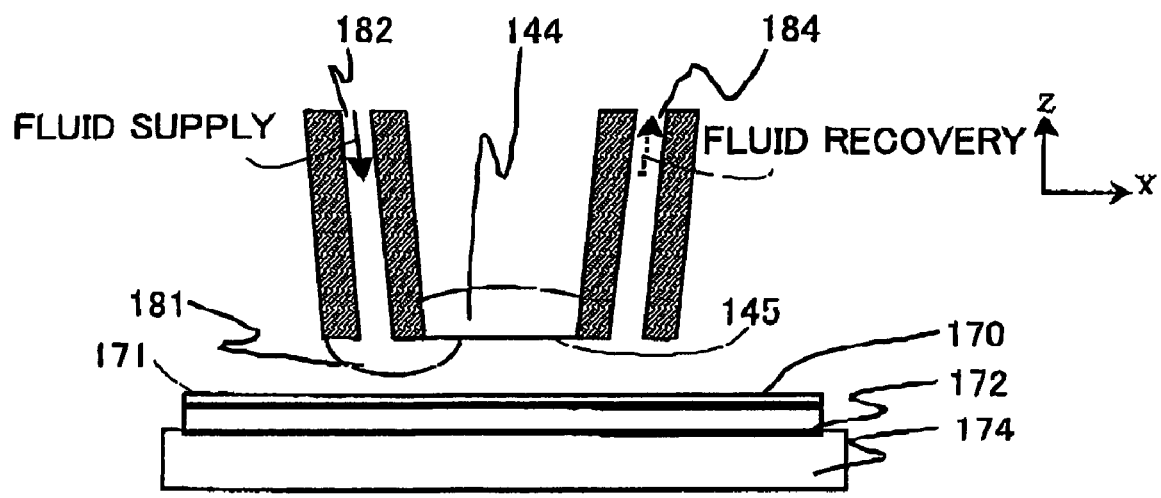
FIGS. 12A, 12B and 12C are schematic partial enlarged sectional views of an exposure apparatus shown in FIG. 1 for explaining a filling step shown in FIG. 11.

Referring now to FIGS. 11 and 12, a description will be given of the filling step 1200 according to a fifth embodiment. Here, FIG. 11 is a flowchart of the filling step 1200 of the fifth embodiment. FIG. 12 is a schematic enlarged sectional view near the wafer 170 and the final optical element 144 in the projection optical system 140 in each sub-step in the filling step 1200 of the fifth embodiment. The structure of this embodiment is similar to that of the first embodiment, but this embodiment sets an initial state different from that of the first embodiment. This embodiment sets an interval between the wafer 170 and the optical element 144 wider than that in the step 1300 or 1400, fills the fluid 181 in the space between them, and then narrows the space to a desired interval (or the interval in the step 1300 or 1400). For example, when the desired interval for the exposure is 100 μm, about 1 mm is preferable as the interval in FIG. 12A.

First, the main controller 150 supplies, similar to the step 1202, a predetermined amount of fluid 181 from the supply nozzle 182 by controlling the supply source (not shown), as shown in FIG. 12A, so that the droplet adheres to the bottom surface 145 of the final optical element 144 (step 1242). As discussed, an interval between the wafer 170 and the optical element 144 is set wider than the desired interval. While the instant embodiment supplies the fluid 181 from the supply nozzle 182, the present invention is not limited to this embodiment and may use the supply nozzle 186 as in the third and fourth embodiments. However, this case moves the wafer stage 174 so that the droplet is located below the supply nozzle 182 and the droplet supplied from the supply nozzle 182 contacts the initial droplet.

Figure 12B:
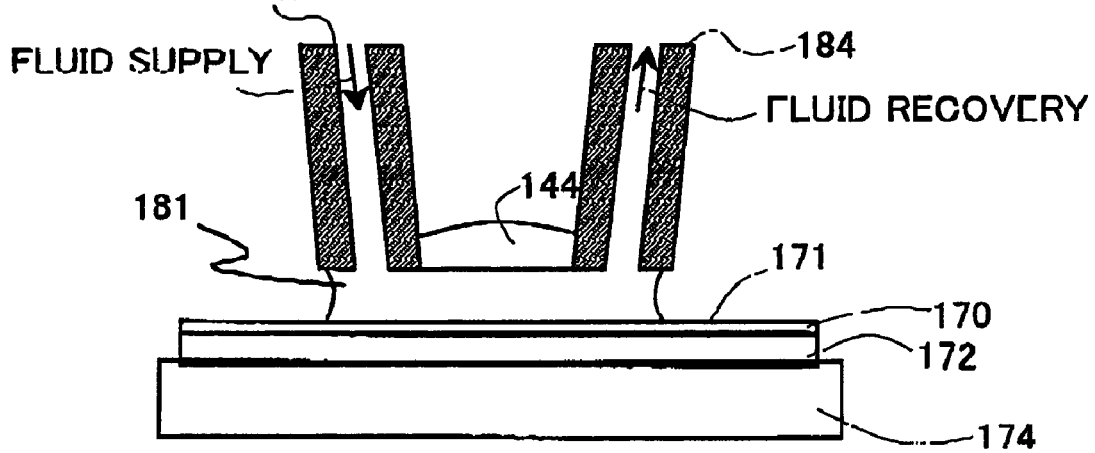

Next, the main control unit 150 supplies the fluid 181 from the supply nozzle 182 by controlling the supply source (not shown), as shown in FIG. 12B, spreading the fluid 181 between the wafer 170 and the optical element 144 (step 1244).

Next, the main control unit 150 drives the wafer stage 174 so that the droplet on the bottom surface 145 approaches to the wafer 170, and the droplet on the surface 171 approaches to the optical element 144 (step 1238). The driving method is similar to that in the step 1226. FIG. 10B omits an inclination of the wafer stage 174. Then, the process moves to the step 1228. As a result, even in this embodiment, the sufficient capillary attraction fills the fluid 181 in the space between the wafer 170 and the optical element 144 without mixing the air bubbles as shown in FIG. 10C. At this time, it is preferable that the recovery nozzle 184 recovers the fluid 181 so as to continuously supply and recover the fluid 181. The supply of the fluid may be or may not be stopped. The wafer stage 174 is moved in the Z direction as in the previous embodiment. Similar to the previous embodiment, the fluid can spread over the part 26 since the capillary attraction is controlled between the lens and the substrate by changing an interval between them.

Figure 12C:
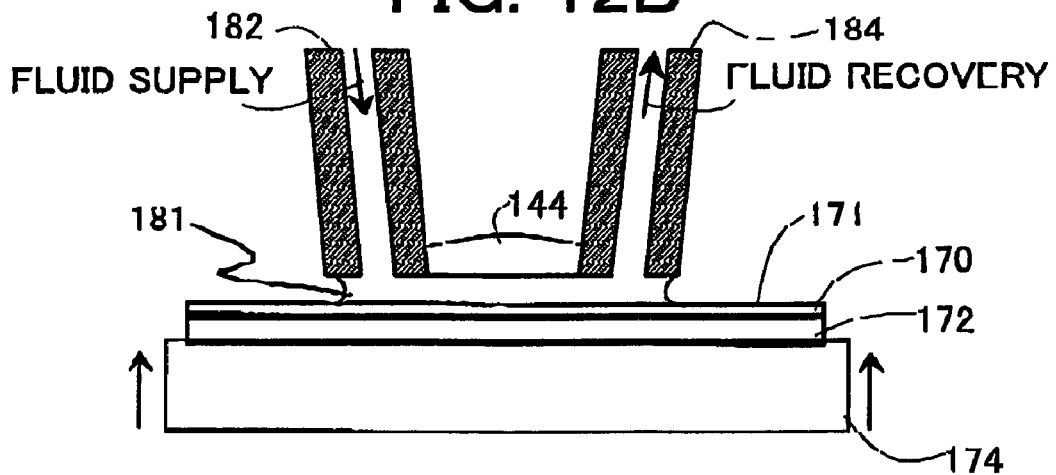

Next, the main control unit 150 controls the driving unit and drives the wafer stage 174 in the Z direction as shown in FIG. 12C, and sets the interval between the wafer 170 and the optical element 144 to the desired interval (step 1246). If necessary, the driving may include an inclination of the wafer stage 174. The fluid 181 is quickly filled since the interval between the wafer 170 and the optical element is maintained wide. By narrowing the interval between the wafer 170 and the optical element 144 from that state, the generation of the air bubbles can be restrained. However, if the supply amount (flow velocity and amount) of the fluid 181 from the supply nozzle 182 is excessively large in FIG. 12A, the air bubbles would occur as soon as the fluid 181 contacts the wafer 170. Even in filling the fluid 181 in the space between the wafer 170 and the optical element 144 in FIG. 12B, if the supply amount (flow velocity and amount) of the fluid 181 from the supply nozzle 182 is excessively large, the air bubbles would occur as soon as the fluid 181 contacts the wafer 170. Therefore, preferred control over supplying the fluid 181 from the supply nozzle 182 or in the step after FIG. 12A is such that the supply amount (flow velocity and amount) of the fluid 181 from the supply nozzle 182 becomes small. For example, after the fluid 181 is filled in a space between the wafer 170 and the optical element 144 and the interval between them is set to the desired interval, the supply amount (flow velocity and amount) of the fluid 181 is preferably controlled to be small.

Then, the procedure moves to the following step 1300.

In the step 1300, the supply nozzle 182 continuously supplies the fluid 181 and the recovery nozzle 184 continuously recovers the fluid 181. The fluid 181 filled in the filling step 1200 serves as priming, and the fluid 181 is continuously supplied to the space between the wafer 170 and the optical element 144 and continuously recovered from the space between them.

Turning back to FIG. 1, a description will be given of the step 1400. In the projection exposure step 1400, a beam emitted from the laser 112 is reshaped into a desired beam shape by the beam shaping system 114, and then enter the illumination optical system. The condenser optical system 116 guides the beam to the optical integrator 118 efficiently. At that time, the exposure-amount regulator adjusts the exposure dose of the illumination light. The main control unit 150 selects an opening shape and a polarization state as an illumination condition suitable for the mask pattern. The optical integrator 118 makes the illumination light uniform, and the aperture stop 120 sets a desired effective light source shape. The illumination light illuminates the mask under optimal illumination conditions via the condenser lens 122, deflecting mirror 124, masking blade 126, and imaging lens 128.

The projection optical system 140 reduces at a predetermined magnification and projected onto the wafer 170 the light that passes the mask 130. The exposure apparatus in the step and scan manner fixes the light source 112 and the projection optical system 140, and synchronously scans the mask 130 and the wafer 170 to expose the entire shots. Then, the wafer stage 174 is stepped to the next shot for a new scan operation. This scan and step are repeated, and many shots are exposed on the wafer 170. The exposure apparatus in the step and repeat manner fixes the mask and wafer 170 during the exposure.

Since the final surface of the projection optical system 140 at the side of the wafer 170 is immersed in the fluid 181 that has a refractive index higher than that of the air, the projection optical system 140 has a higher NA and provides the higher resolution on the wafer 170. In particular, the filling step prevents mixtures of the air bubbles and provides high-quality exposure. Thereby, the exposure apparatus 100 transfers a pattern to a resist with high precision, and provides a high-quality device, such as a semiconductor device, a LCD device, an image pick-up device (e.g., a CCD), and a thin-film magnetic head.

Figure 13:
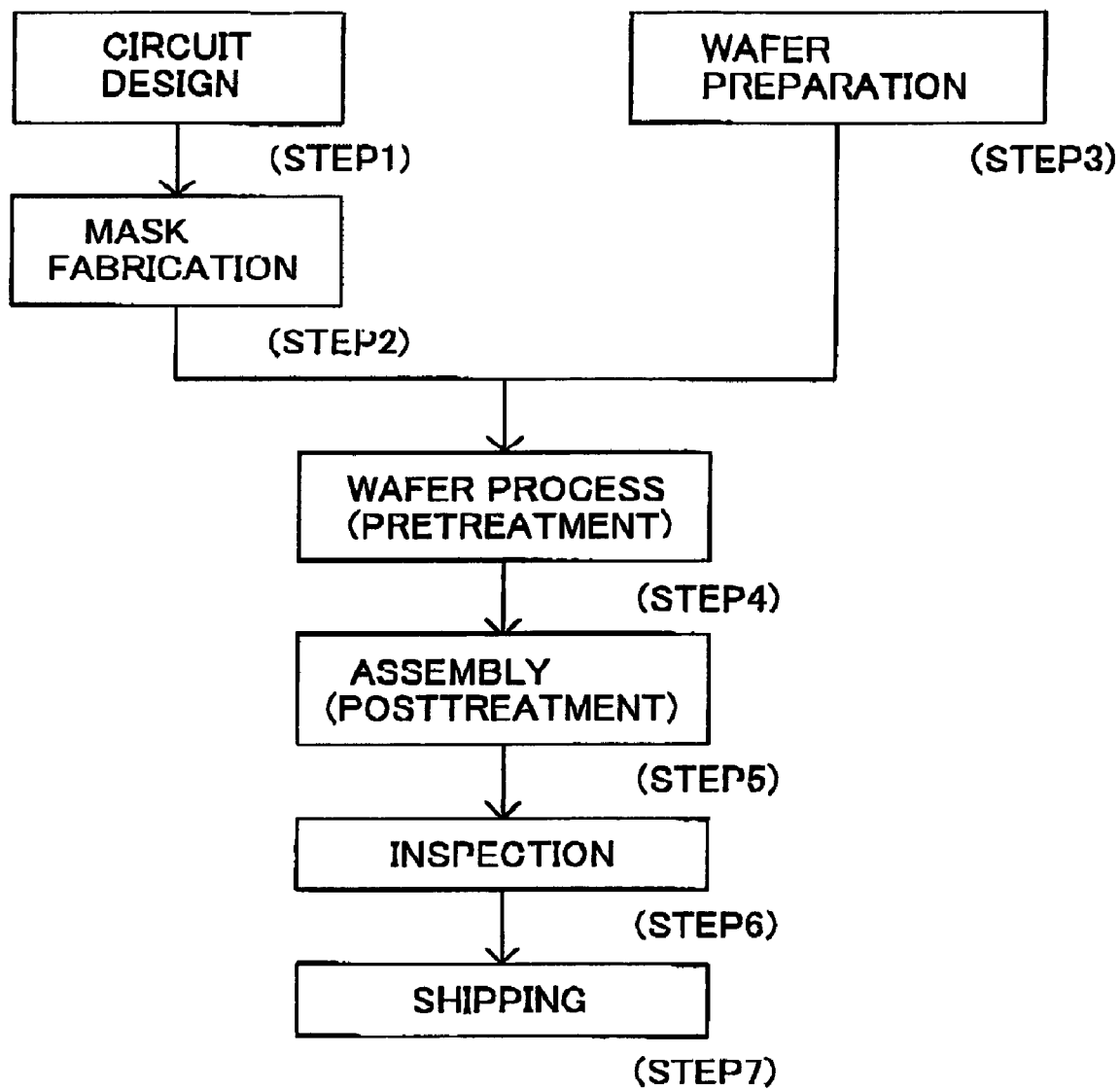
FIG. 13 is a flowchart for explaining a method for fabricating devices (semiconductor chips such as ICs, LSIs, and the like, LCDs, CCDs, etc.).
Figure 14:
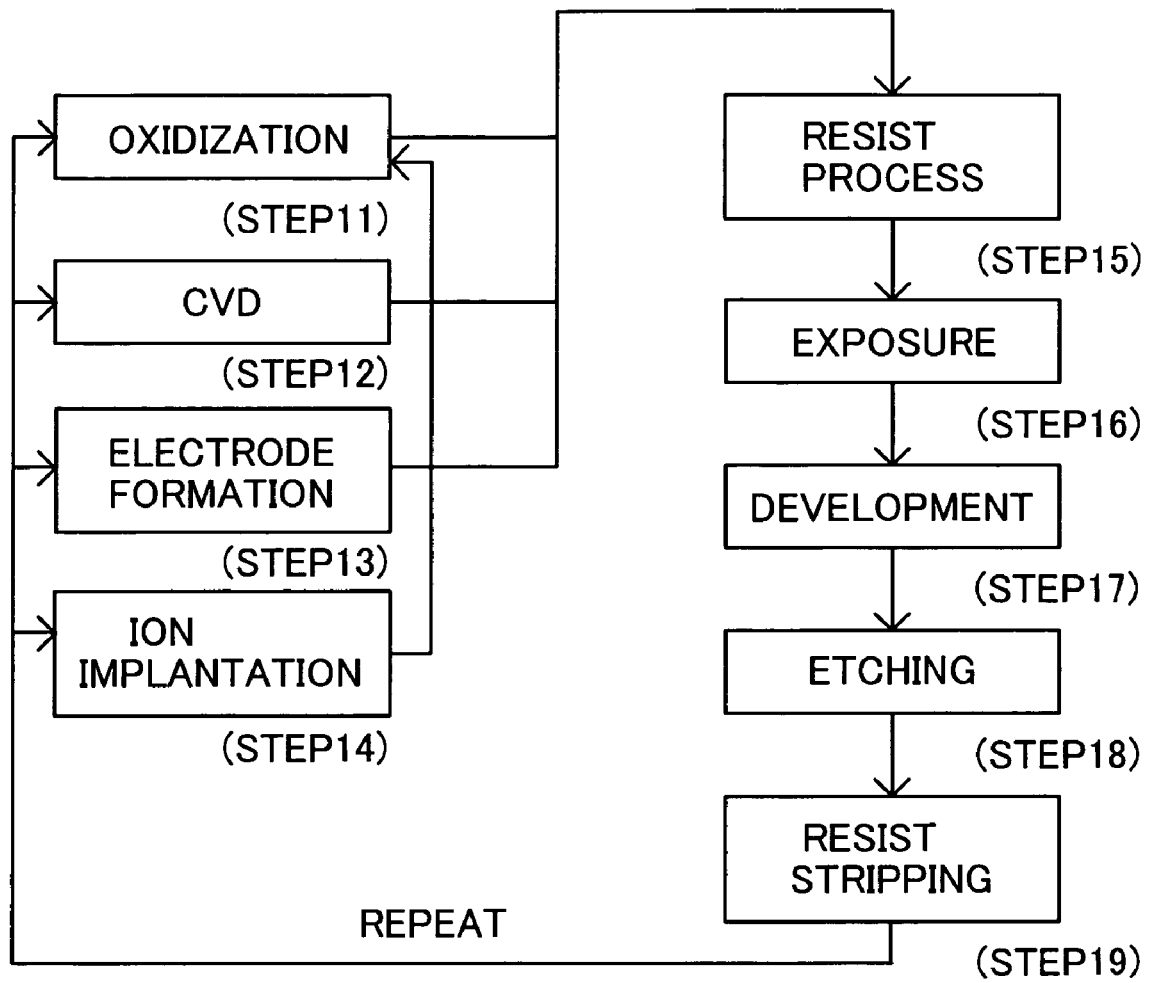
FIG. 14 is a detailed flowchart for Step 4 of wafer process shown in FIG. 13.

Referring to FIGS. 13 and 14, a description will now be given of an embodiment of a device fabricating method using the above mentioned exposure apparatus. FIG. 13 is a flowchart for explaining a fabrication of devices (i.e., semiconductor chips such as IC and LSI, LCDs, CCDs, etc.) Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 14 is a detailed flowchart of the wafer process in Step 4 shown in FIG. 13. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ions into the wafer. Step 15 (resist process) applies a photosensitive material onto the wafer. Step 16 (exposure) uses the exposure apparatus to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one. Thus, the device fabrication method using the exposure apparatus, and the devices as finished goods also constitute one aspect of the present invention. The present invention covers devices as intermediate and final products. Such devices include semiconductor chips like an LSI and VLSI, CCDs, LCDs, magnetic sensors, thin film magnetic heads, and the like.

Thus, the present invention can provide an exposure method and apparatus, which prevents the mixture of air bubbles and provide the high-quality exposure.

According to the above embodiments, the immersion type exposure apparatus easily and promptly fills the fluid in the space between the object and the final optical element in the projection optical system without mixing the air bubbles, and continuously supply and recover the fluid using the initially filled fluid as priming. The above embodiments can prevent the deterioration of the transfer accuracy caused by the air bubbles, and realize high-quality exposure. The prompt filling improves the throughput and the productivity of the device manufacturing.

Further, the present invention is not limited to these preferred embodiments, and various variations and modifications may be made without departing from the scope of the present invention. For example, the program that stores the inventive exposure method also constitutes one aspect of the present invention. The bottom surface 145 of the final optical element 144 is not limited to a plane.

This application claims foreign priority benefits based on Japanese Patent Application No. 2003-433009, filed on Dec. 26, 2003, which is hereby incorporated by reference herein in its entirety as if fully set forth herein.

What is claimed is:

1. An exposure method comprising
 a filling step comprising adhering a predetermined amount of fluid to one surface an object to be exposed and a final surface of a projection optical system, touching part of the fluid adhered to the one to the other of the surface of the object and the final surface of the projection optical system, and spreading the fluid between the surface of the object and the final surface of the projection optical system by capillarity; and
 projecting a mask pattern onto the object via the projection optical system and the fluid;
 setting a distance in an optical-axis direction between the surface of the object and the final surface of the projection optical system, larger than that for said projecting step,
 wherein said filling step changes the capillary attraction in said spreading step by returning the distance in the optical-axis direction between the surface of the object and the final surface of the projection optical system to the distance for said projecting step.

2. An exposure method according to claim 1, further comprising introducing fluid to the space between the surface of the object to be exposed, and the final surface of the projection optical system.

3. An exposure method according to claim 1, further comprising, after said filling step, the step of continuously supplying the fluid to and recovering the fluid from the space between the surface of the object and the final surface of the projection optical system.

4. An exposure method according to claim 1, wherein said filling step changes an angle between the surface of the object and the final surface of the projection optical system, differently from that during said projecting step.

5. An exposure method according to claim 2, wherein said filling step changes the capillary attraction as a pre-treatment of said introducing step.

6. An exposure method according to claim 2, wherein said filling step changes the capillary attraction in said introducing step.

7. An exposure method according to claim 3, wherein said filling step changes a supply amount of fluid differently from that of said supplying and recovering step.

8. An exposure method according to claim 1, wherein said touching step changes a distance in an optical-axis direction and/or angle between the surface of the object and the final surface of the projection optical system.

9. An exposure method according to claim 1, wherein said touching step moves the surface of the object and the final surface of the projection optical system relative to each other in a direction substantially perpendicular to an optical-axis direction.

10. An exposure method according to claim 1, wherein said spreading step comprises further supplying a predetermined amount of fluid to the space between the surface of the object and the final surface of the projection optical system.

11. An exposure apparatus comprising:
 a projection optical system for projecting a mask pattern onto an object to be exposed;
 fluid in which a surface of the object and a final surface of the projection optical system is immersed, the object being exposed via said projection optical system and the fluid;
 a first mechanism for adhering a predetermined amount of fluid to one surface an object to be exposed and a final surface of a projection optical system;
 a second mechanism for touching part of the fluid adhered to the one to the other of the surface of the object and the final surface of the projection optical system;
 a third mechanism for spreading the fluid between the surface of the object and the final surface of the projection optical system by capillarity; and
 a controller for controlling a distance in an optical-axis direction between the surface of the object and the final surface of the projection optical system,
 wherein said first, second and third mechanisms fill a space between the surface of the object and the final surface of the projection optical system, and
 wherein capillary attraction changes due to the third mechanism by returning the distance in the optical-axis direction between the surface of the object and the final surface of the projection optical system to the distance for said projecting step.

12. An exposure apparatus according to claim 11 further comprising:
 a fourth mechanism for continuously supplying the fluid to and recovering the fluid from the space between the surface of the object and the final surface of the projection optical system, and
 wherein the controller is for controlling said said first, second and third mechanisms so that said said first, second and third mechanisms introduce the fluid in an introducing condition different from that of said fourth mechanism.

13. A device manufacturing method comprising the steps of: exposing an object using an exposure apparatus according to claim 12; and developing an object that has been exposed.

* * * * *

UNITED STATES PATENT AND TRADEMARK OFFICE
CERTIFICATE OF CORRECTION

| | | |
|---|---|---|
| PATENT NO. | : 7,177,006 B2 | Page 1 of 1 |
| APPLICATION NO. | : 11/022033 | |
| DATED | : February 13, 2007 | |
| INVENTOR(S) | : Tokita | |

It is certified that error appears in the above-identified patent and that said Letters Patent is hereby corrected as shown below:

At Column 16:

Line 57,   Please delete "said" (second instance).

Line 58,   Please delete "said" (second instance).

Signed and Sealed this

Twenty-seventh Day of March, 2007

JON W. DUDAS
*Director of the United States Patent and Trademark Office*

UNITED STATES PATENT AND TRADEMARK OFFICE
CERTIFICATE OF CORRECTION

| | | |
|---|---|---|
| PATENT NO. | : 7,177,006 B2 | Page 1 of 1 |
| APPLICATION NO. | : 11/022033 | |
| DATED | : February 13, 2007 | |
| INVENTOR(S) | : Tokita | |

It is certified that error appears in the above-identified patent and that said Letters Patent is hereby corrected as shown below:

At Column 16:

Line 57, Please delete "said" (second instance).

Line 58, Please delete "said" (second instance).

Signed and Sealed this

Tenth Day of April, 2007

JON W. DUDAS
*Director of the United States Patent and Trademark Office*